United States Patent
Choi et al.

(10) Patent No.: US 9,298,220 B2
(45) Date of Patent: *Mar. 29, 2016

(54) CURVED DISPLAY AND ELECTRONIC DEVICE INCLUDING THE SAME

(71) Applicant: SAMSUNG ELECTRONICS CO., LTD., Suwon-si (KR)

(72) Inventors: Jong Min Choi, Seongnam-si (KR); Soon Woong Yang, Yongin-si (KR); Jong Chul Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/827,078

(22) Filed: Aug. 14, 2015

(65) Prior Publication Data

US 2016/0066412 A1    Mar. 3, 2016

Related U.S. Application Data

(63) Continuation-in-part of application No. 14/709,996, filed on May 12, 2015.

(30) Foreign Application Priority Data

Sep. 2, 2014    (KR) .......................... 10-2014-0116501
Jul. 14, 2015    (KR) .......................... 10-2015-0099481

(51) Int. Cl.
*G06F 1/16*       (2006.01)
*G06F 3/041*     (2006.01)
*H04M 1/00*    (2006.01)
(Continued)

(52) U.S. Cl.
CPC ............ *G06F 1/1637* (2013.01); *G06F 1/1601* (2013.01); *G06F 3/047* (2013.01); *G06F 3/0488* (2013.01); *H05K 1/028* (2013.01);
(Continued)

(58) Field of Classification Search
CPC .... G06F 3/0488; G06F 1/1637; G06F 1/1601
USPC ............. 361/679.01–679.45, 679.55–679.59; 345/156, 157, 168, 169, 173; 455/566
See application file for complete search history.

(56) References Cited

U.S. PATENT DOCUMENTS 7,884,808 B2    2/2011    Joo
8,195,244 B2    6/2012    Smoyer et al.
(Continued)

FOREIGN PATENT DOCUMENTS

JP     2014-115544 A    6/2014
KR    10-2008-0084497 A    9/2008
(Continued)

OTHER PUBLICATIONS

Notice of Allowance dated Apr. 17, 2015 issued by the Korean Intellectual Property Office in counterpart Application No. 10-2014-0116501.

(Continued)

*Primary Examiner* — Nidhi Thaker
(74) *Attorney, Agent, or Firm* — Sughrue Mion, PLLC

(57) ABSTRACT

A curved display including an external protective layer with an edge at least a part of which has a certain curvature, an opaque layer disposed at the edge of the external protective layer, and a panel module layer including an electrode trace area aligned under the opaque layer.

20 Claims, 16 Drawing Sheets

(51) Int. Cl.
*H05K 1/02* (2006.01)
*G06F 3/047* (2006.01)
*H05K 5/00* (2006.01)
*H05K 7/20* (2006.01)
*G06F 3/0488* (2013.01)

(52) U.S. Cl.
CPC ........... *H05K 5/0017* (2013.01); *H05K 5/0086* (2013.01); *H05K 7/2039* (2013.01)

(56) References Cited

U.S. PATENT DOCUMENTS

| | | | |
|---|---|---|---|
| 8,195,254 B2 | 6/2012 | Oksman et al. | |
| 8,294,055 B2 | 10/2012 | Kim et al. | |
| 8,723,824 B2 | 5/2014 | Myers et al. | |
| 2008/0223708 A1* | 9/2008 | Joo | H04M 1/0202 200/600 |
| 2010/0085692 A1 | 4/2010 | Kim et al. | |
| 2010/0216514 A1* | 8/2010 | Smoyer | G06F 1/1647 455/566 |
| 2011/0151935 A1* | 6/2011 | Oksman | G06F 1/1624 455/566 |
| 2013/0002133 A1* | 1/2013 | Jin | G06F 1/169 313/511 |
| 2013/0002572 A1* | 1/2013 | Jin | G02F 1/33305 345/173 |
| 2013/0076649 A1* | 3/2013 | Myers | H04M 1/0268 345/173 |
| 2013/0088662 A1* | 4/2013 | Watanabe | G02F 1/133308 349/58 |
| 2014/0063705 A1 | 3/2014 | Song | |
| 2014/0104762 A1 | 4/2014 | Park | |
| 2014/0168090 A1* | 6/2014 | Aaltonen | G06F 1/1601 345/173 |
| 2014/0192463 A1* | 7/2014 | Jung | G06F 1/1652 361/679.01 |
| 2014/0247405 A1 | 9/2014 | Jin et al. | |
| 2014/0313746 A1* | 10/2014 | Song | G06F 1/1637 362/362 |
| 2015/0241917 A1* | 8/2015 | Seok | A61B 5/681 361/679.03 |

FOREIGN PATENT DOCUMENTS

| | | | | |
|---|---|---|---|---|
| KR | 10-2010-0037763 A | | 4/2010 | |
| KR | 20100037763 A | * | 4/2010 | ........ B29C 45/14811 |
| KR | 10-2014-0031491 A | | 3/2014 | |
| KR | 20140031491 A | * | 3/2014 | .......... H04M 1/0266 |
| KR | 10-2014-0046839 A | | 4/2014 | |
| KR | 10-2014-0066253 A | | 5/2014 | |
| KR | 10-1402471 B1 | | 6/2014 | |

OTHER PUBLICATIONS

Communication dated Nov. 23, 2015, issued by the European Patent Office in counterpart European Application No. 15167903.2.

Communication dated Dec. 23, 2015, issued by the European Patent Office in counterpart European Application No. 15181119.7.

Communication dated Jan. 5, 2016, issued by the European Patent Office in counterpart European Application No. 15182063.6.

* cited by examiner

CURVED DISPLAY AND ELECTRONIC DEVICE INCLUDING THE SAME

CROSS-REFERENCE TO RELATED APPLICATION

This application is a continuation-in-part of U.S. patent application Ser. No. 14/709,996, filed on May 12, 2015, in the U.S. Patent and Trademark Office, which claims priority from Korean Patent Application Nos. 10-2014-0116501, filed on Sep. 2, 2014, and 10-2015-0099481, filed on Jul. 14, 2015, in the Korean Intellectual Property Office, the disclosures of which are hereby incorporated by reference in their entireties.

BACKGROUND

1. Field

Aspects of exemplary embodiments relate to an electronic device having a curved display area.

2. Background

A conventional electronic device, such as a smartphone, provides a flat screen related to various user functions.

To extend a display area of such conventional electronic device, the size of a flat display area should be increased, causing an increase in the overall size of the electronic device. Such an increase in size may degrade the portability of an electronic device, particularly, a mobile electronic device, such as a smartphone.

SUMMARY

Aspects of exemplary embodiments are directed to providing a display having a curved display area, to extend a display area while maintaining a certain size, and an electronic device including the same.

According to an aspect of an exemplary embodiment, there is provided a mobile electronic device including a display comprising a flat surface area and a curved surface area extending from the flat area as one piece therewith, the curved surface area being bent towards one side of the flat area, the curved surface area having a size smaller than a size of the flat area; and a case disposed along a periphery of the display, at least a part of the case protruding over an edge of the curved surface area, wherein the display includes: an external protective layer formed in a shape corresponding to the flat area and the curved surface area, an opaque area disposed at a part of an edge of the curved surface area under the external protective layer, and a panel module disposed under the external protective layer, the panel module comprising a display area and a non-display area, the display area being disposed over the flat area and a first part of the curved surface area, the non-display area being disposed at a second part of the curved surface area other than the first part of the curved surface area, and the opaque layer covers an entirety of the non-display area with respect to a vertical direction to the flat area at the edge of the curved surface area.

According to an aspect of an exemplary embodiment, there is provided a mobile electronic device including a display comprising a flat surface area and a curved surface area extending from the flat area as one piece therewith, the curved surface area being bent towards one side of the flat area, the curved surface area having a size smaller than a size of the flat area and a case disposed along a periphery of the display, at least a part of the case protruding over an edge of the curved surface area, wherein the display includes an external protective layer formed in a shape corresponding to the flat area and the curved surface area and a panel module disposed under the external protective layer, the panel module comprising a display area and a non-display area, the display area being disposed over the flat area and a first part of the curved area, the non-display area being disposed at a second part of the curved area other than the first part of the curved surface area, and wherein an end of the panel module comprising at least a part of the non-display area extends further than an end of the curved surface area of the external protective layer and configured to be inserted into a support groove formed in one side of the case.

DETAILED DESCRIPTION OF EXEMPLARY EMBODIMENTS

Figure 1A:
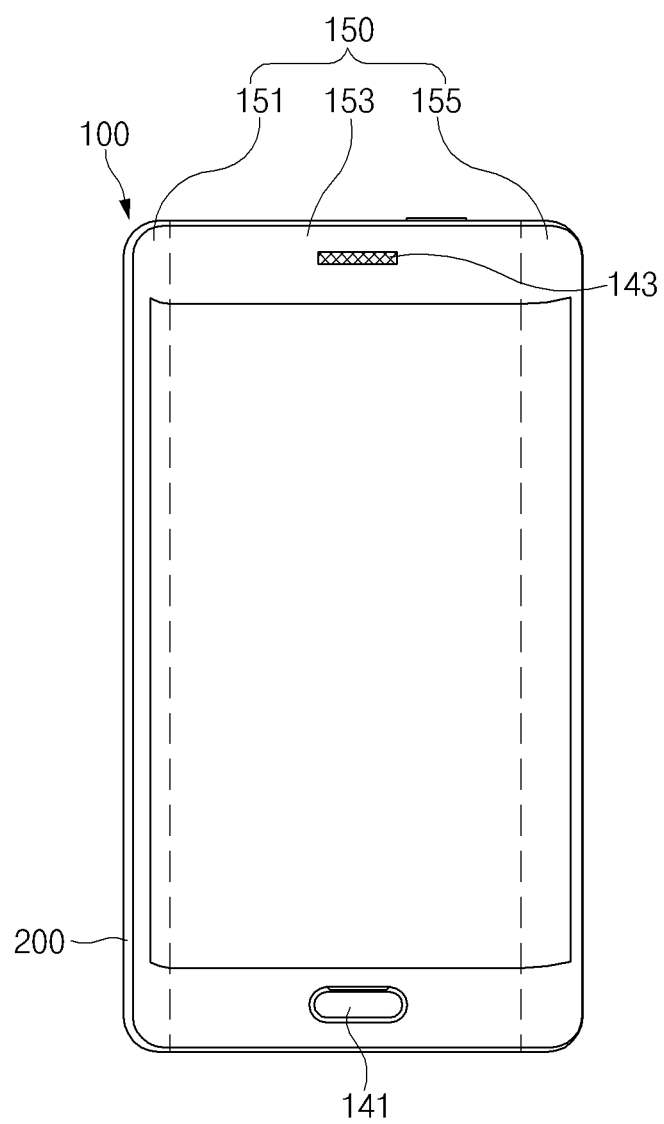
FIG. 1A is a diagram illustrating a front side of an electronic device according to an exemplary embodiment.

Hereinafter, exemplary embodiments of the present disclosure will be described in detail with reference to the accompanying drawings. However, it should be understood that the present disclosure is not limited to the specific exemplary embodiments, but rather includes various modifications, equivalents and/or alternatives of the exemplary embodiments of the present disclosure. Regarding description of the drawings, like reference numerals may refer to like elements.

The term "have", "may have", "include", "may include" or "comprise" used herein indicates the existence of a corresponding feature (e.g., a number, a function, an operation, or an element) and does not exclude the existence of an additional feature.

The term "A or B", "at least one of A and/or B", or "one or more of A and/or B" may include all possible combinations of items listed together. For example, the term "A or B", "at least one of A and B", or "at least one of A or B" may indicate all the cases of (1) including at least one A, (2) including at least one B, and (3) including at least one A and at least one B.

The term "first", "second" or the like used herein may modify various elements regardless of order and/or priority, but does not limit the elements. Such terms may be used to distinguish one element from another element. For example, "a first user device" and "a second user device" may indicate different user devices regardless of order or priority. For example, without departing the scope of the present disclosure, a first element may be referred to as a second element and vice versa.

It will be understood that when a certain element (e.g., a first element) is referred to as being "operatively or communicatively coupled with/to" or "connected to" another element (e.g., a second element), the certain element may be coupled to the other element directly or via another element (e.g., a third element). However, when a certain element (e.g., a first element) is referred to as being "directly coupled" or "directly connected" to another element (e.g., a second element), there may be no intervening element (e.g., a third element) between the element and the other element.

The term "configured (or set) to" may be interchangeably used with the term, for example, "suitable for", "having the capacity to", "designed to", "adapted to", "made to", or "capable of". The term "configured (or set) to" may not necessarily have the meaning of "specifically designed to". In some cases, the term "device configured to" may indicate that the device "may perform" together with other devices or components. For example, the term "processor configured (or set) to perform A, B, and C" may represent a dedicated processor (e.g., an embedded processor) for performing a corresponding operation, or a generic-purpose processor (e.g., a CPU or an application processor) for executing at least one item of software or program stored in a memory device to perform a corresponding operation.

The terminology used herein is not for delimiting the present disclosure, but is for describing specific exemplary embodiments. The terms of a singular form may include plural forms unless otherwise specified. The terms used herein, including technical or scientific terms, have the same meanings as would be understood by those skilled in the art. Commonly-used terms defined in a dictionary may be interpreted as having meanings that are the same as or similar to contextual meanings defined in the related art, and should not be interpreted in an idealized or overly formal sense unless otherwise defined explicitly. Depending on cases, even the terms defined herein should not be such interpreted as to exclude the exemplary embodiments of the present disclosure.

An electronic device according to exemplary embodiments of the present disclosure may include at least one of a smartphone, a tablet personal computer (PC), a mobile phone, a video telephone, an electronic book reader, a desktop PC, a laptop PC, a netbook computer, a personal digital assistant (PDA), a portable multimedia player (PMP), an MP3 player, a mobile medical device, a camera or a wearable device (e.g., smartglasses, a head-mounted device (HMD), electronic apparel, an electronic bracelet, an electronic necklace, an electronic appcessory, an electronic tattoo or a smartwatch).

In some exemplary embodiments, the electronic device may be a smart home appliance. The smart home appliance may include at least one of, for example, a TV, a DVD player, an audio, a refrigerator, an air conditioner, a cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™, PlayStation™), an electronic dictionary, an electronic key, a camcorder, or an electronic picture frame.

In another exemplary embodiment, the electronic device may include at least one of various medical devices (e.g., various portable medical measurement devices: a blood glucose measuring device, a heart rate measuring device, a blood pressure measuring device, or a body temperature measuring device), magnetic resonance angiography (MRA), magnetic resonance imaging (MRI), computed tomography (CT), a scanner, or an ultrasonic device), a navigation device, a global positioning system (GPS) receiver, an event data recorder (EDR), a flight data recorder (FDR), a vehicle infotainment device, electronic equipment for vessels (e.g., a navigation system or a gyrocompass), avionics, a security device, a head unit for a vehicle, an industrial or home robot, an automatic teller's machine (ATM), a point of sales (POS) of a store, or an Internet of things device (e.g., a bulb, various sensors, an electric or gas meter, a sprinkler, a fire alarm, a thermostat, a streetlamp, a toaster, exercise equipment, a hot water tank, a heater, or a boiler).

According to exemplary embodiments, the electronic device may include at least one of a part of furniture or a building/structure, an electronic board, an electronic signature receiving device, a projector, or a measuring instrument (e.g., a water meter, an electricity meter, a gas meter, or a wave meter). In the exemplary embodiments, the electronic device may be one or more combinations of the above-mentioned devices. In the exemplary embodiments, the electronic device may be a flexible device. The electronic device according to the present disclosure is not limited to the above-mentioned devices, and may include new electronic devices with the development of technology.

Hereinafter, an electronic device according to exemplary embodiments will be described with reference to the accompanying drawings. The term "user" used herein may refer to a person who uses an electronic device or may refer to a device (e.g., an artificial electronic device) that uses an electronic device.

FIG. 1A is a diagram illustrating a front side of an electronic device according to an exemplary embodiment.

An electronic device 100 described below may include a housing (e.g., a case). The housing may include an opening (e.g., an edge area of the electronic device 100) with a first side (e.g., a curved surface part) extending in a first direction (e.g., a right or left edge direction with respect to a front side of the electronic device 100) in at least a part of a surface of the housing. The electronic device 100 may include a substantially transparent external protective layer (e.g., glass) including a first edge (e.g., a glass edge) that is disposed within the opening and extends in the first direction while being adjacent to the first side. The glass edge may be a curved surface, also herein described below as a first curved surface. The electronic device 100 may include a panel module layer having a second edge (e.g., an edge of a panel module) that is disposed within the opening, bent to conform with the curved first surface, and extending in the first direction while being adjacent to the first side. The panel module layer may be a flexible panel module layer including a non-display area, at which no image is displayed, that extends in the first direction along the second edge and has a first width in a vertical direction to the first direction. Furthermore, the electronic device 100 may include an opaque layer disposed within the opening, the opaque layer being interposed between the external protective layer and the panel module layer. The opaque layer may extend in the first direction while being adjacent to the first side, and the opaque layer may include a second width in a vertical direction to the first direction. The second width of the opaque layer may have such a dimension that at least a part of the non-display area in a direction of the first width is covered by the opaque layer. The opaque layer may include, for example, a black matrix.

According to exemplary embodiments, the panel module layer may include a first face facing the external protective layer and a second face facing away from the external protective layer, and the electronic device 100 may further include a sealing layer (e.g., a protective member) at a side of the second face.

The electronic device 100 may further include a touch sensing layer (e.g., a touch sheet or screen) that is bent to conform with the first surface. The touch sensing layer may have a third edge (e.g., an edge of a touch sheet) adjacent to the first edge, and is interposed between the external protective layer and a display layer. In the electronic device 100, the external protective layer further includes a substantially flat second surface extending from the first surface. Furthermore, in the electronic device 100, the opaque layer may be positioned to further cover a part of a display area of the panel module layer adjacent to the non-display area.

Referring to FIG. 1A, the electronic device 100 according to exemplary embodiments may include a display 150 (e.g., including the external protective layer, the flexible panel module layer (e.g., including the touch sensing layer (touch sheet), or the touch sensing layer is separately disposed), and the opaque layer) at least one side edge of which has a curved shape (or a curved display area), a speaker 143 disposed at one or more sides of the display, a key button 141, and a case 200 (e.g., the housing).

The display 150 (e.g., at least one of glass (e.g., the external protective layer), a panel module (e.g., the panel module layer or flexible panel module layer), an electromagnetic induction panel, and a heat-dissipating sheet) may include, for example, a first curved surface part 151, a flat surface part 153, and a second curved surface part 155. The first curved surface part 151 and the second curved surface part 155 may have different curvatures. According to an exemplary embodiment, the area of the first curved surface part 151 may be smaller than that of the second curved surface part 155. According to various embodiments, the first curved surface part 151 and the second curved surface part 155 may have the same curvature, and may be symmetrically arranged with respect to a center line of the flat surface part 153. Edges of the first and second curved surface parts 151 and 155 may be supported by one side of the case 200. The opaque layer disposed under glass and the non-display area disposed at an edge of the panel module may be vertically aligned at an edge of at least one of the first and second curved surface parts 151 and 155. Accordingly, a display area of an extended panel module may be disposed at an outermost edge of at least one of the first and second curved surface parts 151 and 155.

The case 200 may be generally shaped like a polygon (e.g., a quadrangle), and may cover an exterior of the display 150. According to an exemplary embodiment, the case 200 may have an edge extending along an exterior of the display 150, at least one side edge of which having a curved surface shape. According to an exemplary embodiment, the case 200 may include a built-in battery type. Alternatively, the case 200 may include a detachable battery type. In the case of the battery detachable type, the case 200 may include a case described below (e.g., a front case (integrated with a rear case), or a front case and a rear case) and a battery cover. According to exemplary embodiments, the case 200 may include an opening (e.g., a left or right edge area) including a first side (e.g., a curved surface part), at least a part of which is flat, and at least a part of a surface of which extends in a first direction (e.g., at least one of a left-side direction and a right-side direction with respect to a center of the case 200).

Figure 1B:
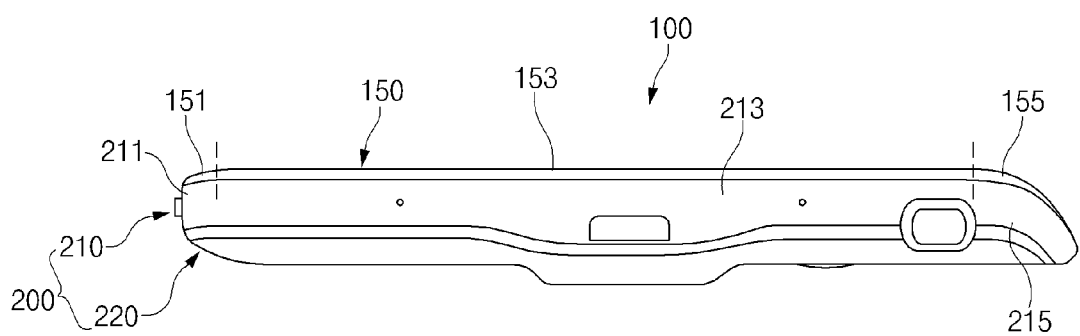
FIG. 1B is a diagram illustrating a side of an electronic device according to an exemplary embodiment.

FIG. 1B is a diagram illustrating a side of the electronic device according to exemplary embodiments.

Referring to FIG. 1B, the electronic device 100 may include the display 150, a first case 210 (e.g., a front case), and a second case 220 (e.g., a rear case or a battery cover covering the rear case).

As described above, the display 150 may include the first curved surface part 151, the flat surface part 153, and the second curved surface part 155. The first curved surface part 151 may have a curvature different than that of the second curved surface part 155. The second curved surface part 155 may be contiguous to an end of the flat surface part 153 and may be bent according to a certain curvature. An end of the first curved surface part 151 may contact one side of the first case 210. An end of the second curved surface part 155 may contact another side of the first case 210.

The first case 210 may include a first curved surface support part 211, a flat surface support part 213, and a second curved surface support part 215. The first case 210 may be provided as a metal frame in which the first curved surface support part 211, the flat surface support part 213, and the second curved surface support part 215 are formed as one continuous piece. According to exemplary embodiments, the first curved surface support part 211, the flat surface support part 213, and the second curved surface support part 215 may be individually provided to be joined to each other. The first case 210 may be made of, for example, a metallic material (or non-metallic material), such as SUS, an aluminum alloy, or a magnesium alloy.

The first curved surface support part 211 may cover an end of the first curved surface part 151, while supporting a bottom of the first curved surface part 151 having a relatively low curvature. According to exemplary embodiments, an end of the first curved surface support part 211 may protrude over the first curved surface part 151 to prevent damage to the first curved surface part 151 while covering the first curved surface part 151. Furthermore, the first curved surface support part 211 may protrude by a predetermined length over an end of the first curved surface part 151 in an outward direction (a direction in which the first curved part 151 extends from the flat part 153). A protruding area of the first curved surface support part 211 may be, for example, rounded. According to exemplary embodiments, at least a part of the protruding area of the first curved surface support part 211 may be provided with a shock absorbing member (e.g., a non-metallic member, such as rubber or polyurethane, or a metallic member, such as a shock absorbing mesh or bumper) disposed in a longitudinal direction or transverse direction of the case.

The flat surface support part 213 may be disposed under the flat surface part 153 of the display 150 to support the flat surface part 153. A battery lower part insertion hole with a certain size, related to insertion of a battery, may be defined in a certain inner area of the flat surface support part 213. A center of the battery lower part insertion hole may be biased towards, for example, the first curved surface support part 211. According to exemplary embodiments, the battery lower part insertion hole may extend over the flat surface support part 213 and a part of the first curved surface support part 211. The flat surface support part 213 may include at least one sidewall supporting at least a part of a center or an edge of the flat surface support part 153, and a certain part of the inside of the flat surface support part 213 may be dented.

The second curved surface support part 215 may cover an end of the second curved surface part 155, while supporting a bottom of the second curved surface part 155 having a relatively high curvature. Here, the second curved surface support part 215 may have a relatively high curvature compared to the first curved surface support part 211. Furthermore, the second curved surface support part 215 may be tapered in a direction to an end (e.g., a direction in which the second curved surface part 155 extends from the flat surface part 153), to support the high curvature of the second curved surface part 155. According to exemplary embodiments, an end of the second curved surface support part 215 may protrude over a surface of the second curved surface part 155 to prevent damage to the second curved surface part 155. For example, the second curved surface support part 215 may have a cross section shaped like a hook, and may have a rounded edge. According to exemplary embodiments, at least one of inner and outer sides of the end of the second curved surface support part 215 shaped like a hook may be provided with a shock absorbing member (e.g., a non-metallic member, such as rubber or polyurethane, or a metallic member, such as a shock absorbing mesh or bumper) disposed in a longitudinal direction or transverse direction of the case.

The second case 220 may be a rear case supporting the bottom of the first case 210 or a battery cover covering a rear case. The second case 220 may be formed by metal injection molding or non-metal injection molding, such as plastic injection molding. The second case 220 may be provided to support a flat lower part of the first curved surface support part 211, a flat lower part of the flat surface support part 213, and a curved lower part of the second curved surface support part 215. A battery upper part insertion hole may be defined in a part of the inside of the second case 220. The battery upper part insertion hole may be aligned with the battery lower part insertion hole. Accordingly, the battery upper part insertion hole may be biased from a vertical center of the second case 220 in one direction (e.g., towards the first curved surface support part 211). According to exemplary embodiments, in the case of the battery detachable type, the battery upper part insertion hole of the second case 220 may be exposed. A battery cover that covers an entire area including the battery upper part insertion hole may be disposed at one side of the second case 220.

According to exemplary embodiments, in the electronic device 100, the front case may be integrated with the rear case. In this case, the second case 220 may be a battery cover. According to an exemplary embodiment, the electronic device 100 may include the built-in battery type. In this case, the first case 210 may be integrated with the second case 220, and the battery cover may not be provided.

As described above, in the electronic device 100 according to exemplary embodiments, the curvature of the second curved surface part 155 may be greater than the curvature of the first curved surface part 151, so that an extended display area may be provided to a side of the electronic device 100. Furthermore, because the non-display area of the panel module disposed on the second curved surface part 155 is disposed under the opaque layer, a display area may be extended on the basis of an extended panel module. Moreover, because the first curved surface part 151 having a relatively low curvature (or no curvature) is provided, the first curved surface support part 211, which may be relatively thick, is provided, so that the electronic device 100 may be more easily grasped by a user.

Figure 2A:
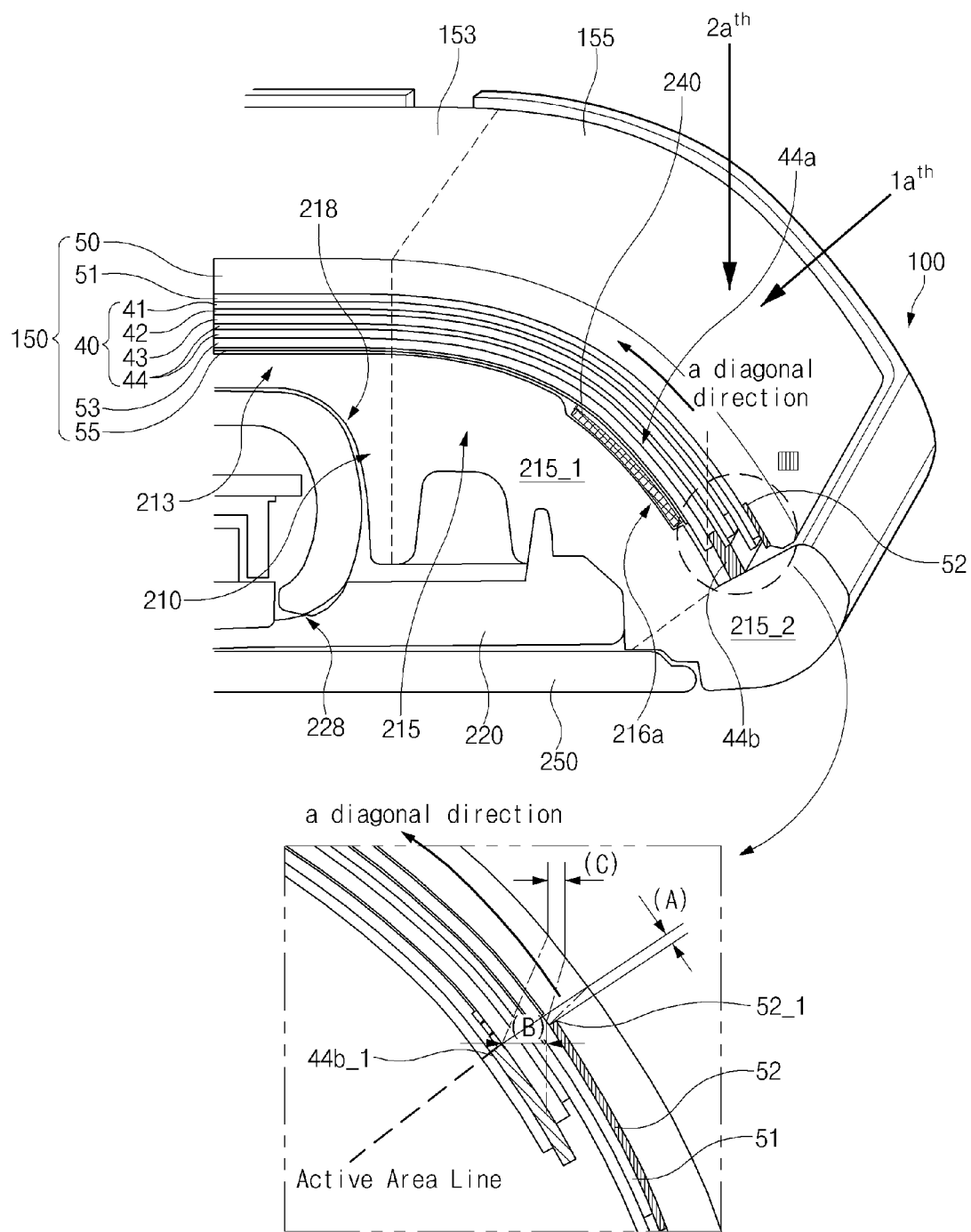
FIG. 2A is a magnified view of a side of a curved surface part according to an exemplary embodiment.

FIG. 2A is a magnified view of an edge area of the (second) curved surface part according to an exemplary embodiment.

Referring to FIG. 2A, a part of the electronic device 100 may include a part of the display 150 (e.g., the flat surface part 153 and the second curved surface part 155 are illustrated), a part of the first case 210 (e.g., the flat surface support part 213 and the second curved surface support part 215 are illustrated), a part of the second case 220, and a part of a battery cover 250. The part of the electronic device 100 will be described below with a focus on an area where the second curved surface part 155 is disposed. The shape of the second curved surface part 155 described below may also be applied to the first curved surface part 151.

The display 150 may include a panel module 40 related to display or control of an image, glass 50 disposed on the panel module 40, an opaque layer 52 (e.g., a black matrix or the like) disposed at one side of a back of an edge of the glass 50, an electromagnetic induction panel 53 (e.g., a digitizer) disposed on or under the panel module 40, and a heat-dissipating sheet 55 (or a heating sheet). Additionally, an adhesive layer 51 may be disposed between the glass 50 and the panel module 40. A non-display area 44b of the panel module 40 may be aligned under the opaque layer 52 of the glass 50, so that the display 150 may be provided with an extended display area 44a.

The panel module 40 may include, for example, a touch sheet 41 (e.g., the touch sensing layer), an adhesive layer 42, a polarizing sheet 43, and a display panel 44. The touch sheet 41 is described as an element of the panel module 40, but exemplary embodiments are not limited thereto. According to exemplary embodiments, the touch sheet 41 may be an element additionally disposed on or under the panel module 40 to support a touch function.

The touch sheet 41 may support, for example, capacitive sensing. The touch sheet 41 may include a touch sensing area, in which signal lines for sensing a touch are arranged in a matrix form, and a trace area for supplying signals to touch sensing signal lines. According to an exemplary embodiment, the trace area may be formed on edges of both sides of the touch sheet 41 or an edge of one side thereof. The trace area may be included in, for example, the non-display area 44b. The adhesive layer 51 may be disposed on the touch sheet 41 so that the touch sheet 41 may be bonded to the glass 50. According to exemplary embodiments, the touch sensing signal line may be formed by a transparent indium tin oxide (ITO) electrode. The trace area may be formed by an opaque metal electrode. The trace area may be disposed on the first curved surface part 151 alone.

The adhesive layer 42 may be disposed between the touch sheet 41 and the polarizing sheet 43 to fix the touch sheet 41 to the polarizing sheet 43. The polarizing sheet 43 may serve to polarize light transmitted through the panel module 40. For example, the polarizing sheet 43 may polarize light irradiated from the display panel outwardly in a regular direction to improve the visibility or viewing angle. The polarizing sheet 43 may be bonded to the touch sheet 41 by the adhesive layer 42. The polarizing sheet 43 may be laminated with the display panel 44. According to exemplary embodiments, an adhesive layer may be additionally disposed between the polarizing sheet 43 and the display panel 44. Alternatively, a polarizing pattern may be formed on a front surface of the display panel 44 to be integrated therewith.

The display panel 44 may have the type of a bendable sheet having a certain thickness. The display panel 44 may include an organic light-emitting diode (OLED) or a liquid crystal display (LCD). The display panel 44 may have a plurality of pixels arranged in a matrix form. The display panel 44 may include, for example, the display area 44*a*, in which the plurality of pixels are arranged, and the non-display area 44*b*, in which pads for supplying pixel control signals are arranged. The pads may be coupled to signal lines of a gate driver or a data driver.

The panel module 40 of the display 150 may include the display area 44*a* and the non-display area 44*b* (e.g., at least a part of an edge area of the panel module 40), in which pads or signal lines are arranged to supply signals to the display area 44*a*. The non-display area 44*b* may be disposed on at least a part of an edge area of the second curved surface part 155 of the display 150. The non-display area 44*b* of the panel module 40 disposed at an edge of the second curved surface part 155 may be disposed under the opaque layer 52. According to exemplary embodiments, the non-display area 44*b* disposed at an edge of the panel module 40, which belongs to the first curved surface part 151, may be aligned under the opaque layer 52 disposed at an edge of the glass 50.

The electromagnetic induction panel 53 may be provided when the electronic device 100 supports generation of an input event through electromagnetic induction by an electronic pen. Accordingly, the electromagnetic induction panel 53 may not be provided if operation of an additional electronic pen is unsupported by the electronic device 100. The electromagnetic induction panel 53 may be disposed under the display panel to support a function of receiving an input from an approaching electronic pen.

The heat-dissipating sheet 55 may be disposed under the electromagnetic induction panel 53 and on the first case 210. The heat-dissipating sheet 55 may dissipate heat generated from, for example, the display panel 44. According to an exemplary embodiment, the heat-dissipating sheet 55 may transfer the heat generated from the display panel 44 to the first case to dissipate the heat.

The glass 50 may be disposed on the panel module 40. The glass 50 may serve to protect the panel module 40 from damage. The glass 50 may be made of, for example, glass, acryl or transparent plastic. As illustrated in FIG. 2A, an edge of the glass 50 may have a certain curvature. An end of the glass 50 may be placed on, for example, the second curved surface support part 215 of the first case 210.

The opaque layer 52 may be disposed under an edge of the glass 50 to prevent light leakage and improve the visibility. The opaque layer 52 may be printed on the back of the glass, or an additional film may be attached thereto as the opaque layer 52. The film may include a pattern on one surface thereof, thereby improving aesthetics of the electronic device 100. The opaque layer 52 may be disposed on the entire edge of the glass 50 with a certain width. The opaque layer 52 may cover a part of the non-display area 44*b* of the panel module 40. Therefore, the width of the opaque layer 52 may be determined according to the size or position of the non-display area 44*b*.

According to an exemplary embodiment, as seen in a normal direction to a curved surface of the glass, an end of the opaque layer 52 may be extended in width outwards (towards an upper side of the curved surface) from an active area (A/A) line that is a boundary between the non-display area 44*b* and the display area by a distance of A (e.g., about 1 mm or less, for example, about 0.03 mm to about 0.3 mm or about 0.026 mm to about 0.38 mm). In case that the end of the opaque layer 52 is disposed inside the line A/A, a partial area of the display may be covered by the opaque layer. Therefore, the end of the opaque layer 52 may be disposed outside the line A/A (e.g., towards the upper side of the curved surface), and the opaque layer 52 may maintain minimal width in consideration of an assembly tolerance. Therefore, at least a portion of the lines of the panel module 40 arranged in the non-display area 44*b* (e.g., the signal supplying lines arranged in the trace area of the touch sheet 41 or the area of the display panel 44 in which the pads or signal supplying lines are arranged) may be covered by the opaque layer 52. As described above, the opaque layer 52 may be disposed to geometrically cover the entirety of the non-display area 44*b* with respect to a front direction or a viewing direction (e.g., a direction perpendicular to a flat area of the electronic device 100). Here, with respect to the direction perpendicular to the flat area of the electronic device 100, an end of a flat area side of the opaque layer 52 may be geometrically vertically aligned (or vertically in parallel) with an end of a flat area side of the non-display area 44*b*.

According to an exemplary embodiment, as seen when viewing the front of the electronic device 100, an inner end of the opaque layer 52 may be spaced apart (or extended) from the line A/A that is the boundary between the non-display area 44*b* and the display area by a distance of B (e.g., within about 1 mm, for example, about 0.5 mm to about 0.72 mm).

When the panel module 40 is seen through the glass 50 at the front of the electronic device 100, light emitted from the panel module 40 is refracted by the glass 50 so that an object appears to be located at a different position when viewed by a user (e.g., from the outside of the glass 50). Therefore, as seen by a user at the front of the electronic device 100, the distance B (e.g., about 1 mm or less, for example, about 0.5 mm to about 0.72 mm) designed to be larger than the distance A (e.g., about 0.02 mm to about 0.4 mm) appears to be a distance C (e.g., about 1 mm or less, for example about 0.264 mm to about 0.5 mm or about 0.2 mm to about 0.3 mm), which is smaller than the distance B. Therefore, the distance A appears relatively similar to the distance C so that a certain amount of a non-active area around the display is viewed evenly, without a user perceptible difference when viewed at the front of the electronic device 100 or in a normal direction to the curved surface, thereby evoking an aesthetic sense.

As described above, with respect to the front direction of the electronic device 100 (e.g., a direction perpendicular to a flat area of the electronic device 100), the opaque layer 52 may be disposed to optically cover or obscure the entirety of the non-display area 44*b* by virtue of a refractive index of at least one layer (e.g., the external protective layer or the panel module layer) included in the display. For example, when a curved surface area of the electronic device 100 is seen from the front direction (e.g., perpendicular direction) of the electronic device 100, the end of the non-display area 44*b* and the end of the opaque layer 52 arranged at the curved surface area may appear to be positioned at locations different from their actual locations due to refractive indices of the external protective layer (e.g., the glass 50) and the panel module 40 disposed under the external protective layer. Accordingly, in the electronic device 100 of the present disclosure, the end of the flat area side of the opaque layer 52 positioned at the curved surface area and the end of the flat area side of the non-display area 44*b* may be arranged so that the end of the flat area side of the opaque layer 52 optically covers or obscures the end of the flat area side of the non-display area 44*b* (e.g., so that the opaque layer 52 covers the non-display area 44*b* as seen visually through at least one of the external protective layer or the panel module) in the front direction (e.g., perpendicular direction to the flat area) of the electronic device 100. In this state, even if the end of the flat area side of the non-display area 44*b* protrudes towards the flat area geometrically farther than the end of the flat area side of the opaque layer 52, the opaque layer 52 may cover the entirety of the non-display area 44*b* optically.

As described above, in a curved surface display area (e.g., the first curved surface part 151 or the second curved surface part 155) of the display 150, the non-display area of the panel module 40 is disposed under the opaque layer 52 so that an area (non-display area), which is not displayed when the panel module 40 is observed through glass 50, may be minimized.

As described above, the first case 210 may include the flat surface support part 213 and the second curved surface support part 215 contiguous to the flat surface support part 213. The second curved surface support part 215 may include a support body 215_1 contiguous to the flat surface support part 213 and a curved surface cover part 215_2 disposed at an end of the support body 215_1.

The support body 215_1 may include an upper surface bent with the curvature of the second curved surface part 155 and a lower surface facing the second case 220. Accordingly, the support body 215_1 may be disposed in parallel with the curved surface part of the display 150. A rail groove 216a may be disposed in at least one side of the upper surface of the support body 215_1. The rail groove 216a may be formed to a predetermined length in a longitudinal direction of the support body 215_1, with a certain width. According to an embodiment, the rail groove 216a may be formed in at least a part of the entire upper surface of the support body 215_1. A display protective member 240 may be disposed inside the rail groove 216a. The protective member 240 may include a sponge or an adhesive tape. The protective member 240 may serve to block moisture or dust from the inside of the electronic device 100.

The curved surface cover part 215_2 may be disposed at an end of the support body 215_1, forming a certain angle with an extending direction of the support body 215_1. According to an exemplary embodiment, the curved surface cover part 215_2 may be perpendicular to an end of the support body 215_1 and may protrude over the upper surface of the support body 215_1 in an outward direction (e.g., a direction to the glass 50). One sidewall of the curved surface cover part 215_2 may face a side surface of the display 150. A protruding end of the curved surface cover part 215_2 may have a height larger than that of the display 150 placed on the one sidewall. Therefore, the curved surface cover part 215_2 may absorb at least a portion of a shock on the electronic device 100 when the electronic device 100 is dropped.

According to exemplary embodiments, the first case 210 may include a battery upper part insertion hole 218. The battery upper part insertion hole 218 may be disposed at the flat surface support part 213 in the first case 210 or may be disposed over the flat surface support part 213 and the first surface support part 211.

The second case 220 supports the first case 210. A battery lower part insertion hole 228 may be disposed in the second case 220. The battery lower part insertion hole 228 may be aligned with the battery upper part insertion hole 218. According to an exemplary embodiment, an end of one side of the second case 220 may face an inner side of the curved surface cover part 215_2. Therefore, at least a part of the second case 220 may be covered by an edge of the first case 210.

The battery cover 250 may cover a lower surface or an exposed surface of the second case 220. According to an exemplary embodiment, the battery cover 250 may cover the battery lower part insertion hole 228 disposed in the second case 220. An end of one side of the battery cover 250 may be joined to the inner side of the curved surface cover part 215_2. The inner side of the curved surface cover part 215_2 may have a multi-step. Therefore, an end of the second case 220 and an end of the battery cover 250 may be stacked on the inner side of the curved surface cover part 215_2. A surface of the battery cover 250 may be aligned in parallel with one side of the curved surface cover part 215_2. According to exemplary embodiments, the battery cover 250 may be integrated with the second case 220, or may be integrated with the first and second cases 210 and 220. In this instance, the battery cover 250 may be fixed to a rear part of the electronic device 100 having the built-in battery type to cover a battery.

A relation between the opaque layer 52 and the non-display area 44b is described below with reference to FIG. 2A.

As illustrated in FIG. 2A, with respect to a $1a^{th}$ direction towards the curved surface area of the external protective layer (e.g., a perpendicular direction to a tangent line to a certain point on the curved surface area), an end 44b_1 of the non-display area 44b may extend in a diagonal direction (e.g., a direction from the curved surface cover part 215_2 to a boundary area between the flat area and the curved surface area) farther than an end 52_1 of the opaque layer 52 by a $1a^{th}$ width. Furthermore, according to an exemplary embodiment of the present disclosure, at an edge of the curved surface area, with respect to a $2a^{th}$ direction (e.g., a perpendicular direction to the flat area or a perpendicular direction to the battery cover 250 placed horizontally), the end 44b_1 of the non-display area 44b may extend farther than the end 52_1 of the opaque layer 52 by a $2a^{th}$ width. Here, the $1a^{th}$ width may substantially approximate to the $2a^{th}$ width. According to an exemplary embodiment of the present disclosure, the specified $1a^{th}$ width (e.g., width of A) may be within about 1 mm. Alternatively, the specified $1a^{th}$ width may be from about 0.02 mm to about 0.4 mm. For example, the $1a^{th}$ width may be adjusted according to a curved surface characteristic applied to an electronic device. According to an exemplary embodiment of the present disclosure, the specified $2a^{th}$ width (e.g., width of C) may be within about 1 mm. Alternatively, the specified $2a^{th}$ width may be from about 0.2 mm to about 0.5 mm. The $2a^{th}$ width may also be adjusted according to a curved surface characteristic applied to an electronic device. According to an exemplary embodiment of the present disclosure, the specified $1a^{th}$ width may be smaller than the $2a^{th}$ width. The end 44b_1 of the non-display area may be related to the boundary line (active area line) of the display area.

Figure 2B:
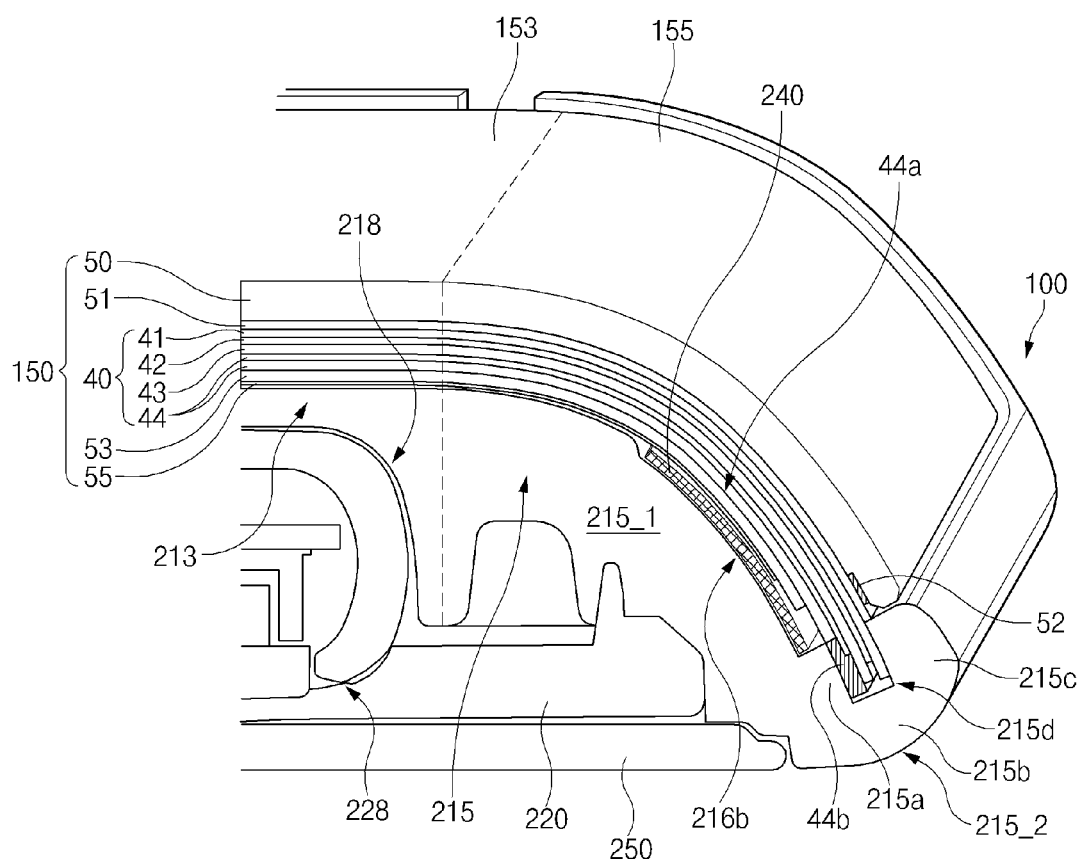
FIG. 2B is a magnified view of a side of a curved surface part according to an exemplary embodiment.

FIG. 2B is a magnified view of a side of the (second) curved surface part according to an exemplary embodiment.

Referring to FIG. 2B, a part of the electronic device 100 may include a part of the display 150 (e.g., the flat surface part 153 and the second curved surface part 155), a part of the first case 210, a part of the second case 220, and a part of a battery cover 250.

The first case 210 may include the support body 215_1 and the curved surface cover part 215_2. The curved surface cover part 215_2 may include, for example, a first sidewall 215a, a second sidewall 215c, a connection part 215b, and a support groove 215d.

The first sidewall 215a may be contiguous to the support body 215_1, and may protrude over the upper surface of the support body 215_1 by a certain distance. Ends of some elements of the display 150, for example, the electromagnetic induction panel 53 and the heat-dissipating sheet 55, may be arranged on a side surface of the first sidewall 215a. The second sidewall 215c may be spaced apart from the first sidewall 215 by a distance of a width of the support groove 215d. The second sidewall 215c may protrude over a surface of the glass 50 of the display 150. An end of the glass 50 may be disposed on a side surface of the second sidewall 215c. According to exemplary embodiments, an end of the opaque layer 52 may be disposed on a side surface of the second sidewall 215c. The connection part 215b connects bottoms of the first and second sidewalls 215a, 215c to form the support groove 215d. Ends of some elements of the display 150, for example, an end of the panel module 40 may be disposed on a surface of the connection part 215b, which is opened by the support groove 215d. Some parts of the display 150, for example, a part of an edge area of the panel module 40 may be inserted into the support groove 215d. For example, the non-display area 44b of the panel module 40 may be inserted into the support groove 215d. According to an exemplary embodiment, the support groove 215d may have depth that is the same as depth of the non-display area 44b, or may have a depth larger than the depth of the non-display area 44b by a predetermined distance. According to exemplary embodiments, the panel module 40, the electromagnetic induction panel 53, and the heat-dissipating sheet 55 may be arranged in the support groove 215d.

The display 150 may include the panel module 40 that protrudes over the glass 50 in a bending direction of the second curved surface part 155. For example, the panel module 40 may disposed that an edge of the second curved surface part 155 protrudes over an end of the glass 50 by a certain distance (e.g., the width of the non-display area 44b). The protruding panel module 40 may be inserted into the support groove 215d.

As described above, because the non-display area 44b of the panel module 40 is inserted into the support groove 215d, an additional opaque layer may not be provided to the display 150. In addition, a rail groove 216b for receiving the display protective member 240 may be disposed in at least a portion of the first sidewall 215a or one side of the support body 215_1 under the panel module 40 or the heat-dissipating sheet.

Figure 2C:
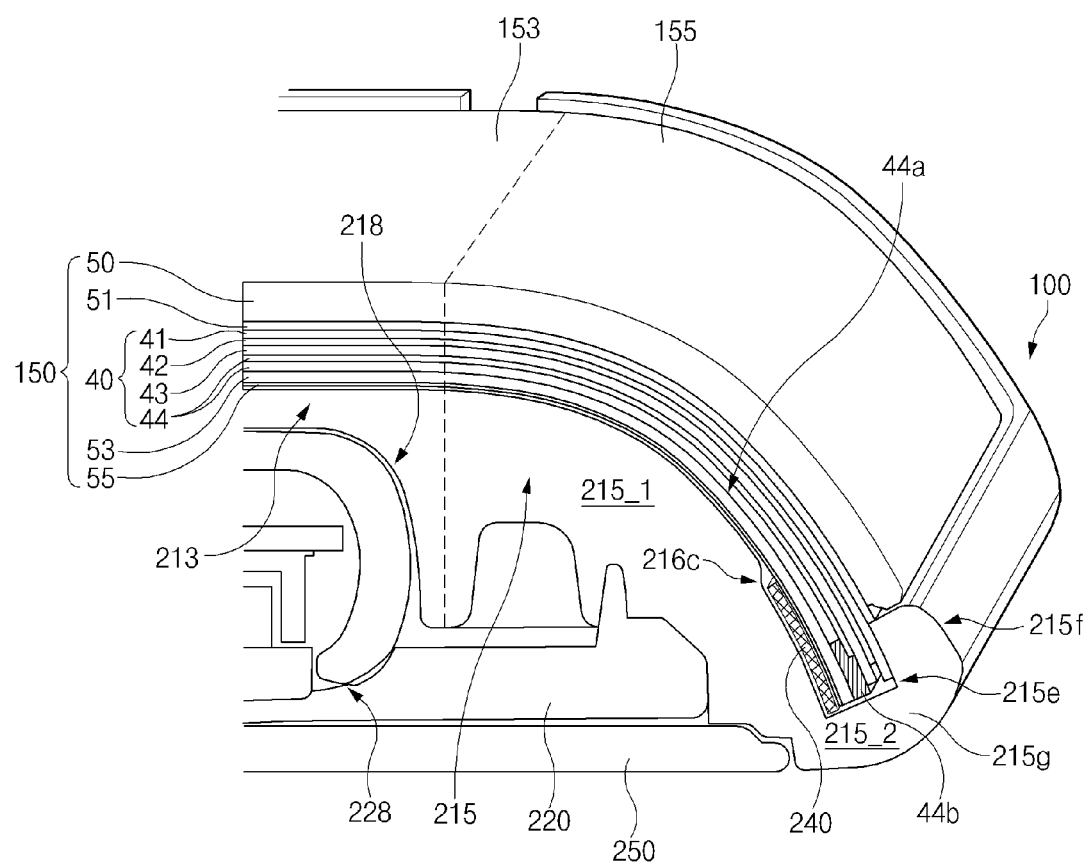
FIG. 2C is a diagram illustrating a second curved surface support part according to an exemplary embodiment.

FIG. 2C is a diagram illustrating the (second) curved surface support part according to an exemplary embodiment.

Referring to FIG. 2C, the second curved surface support part 215 may include the support body 215_1 and the curved surface cover part 215_2. The curved surface cover part 215_2 may include, for example, a connection part 215g disposed at one end of the upper surface of the support body 215_1 forming a certain angle (e.g., a right angle or an acute angle) with the upper surface of the support body 215_1 and a sidewall 215f (compared to FIG. 2B, the sidewall 215a is removed). In this case, the elements of the display 150, except for the glass 50, may be arranged in a support groove 215e formed by the connection part 215g and the sidewall 215f. For example, the panel module 40, the electromagnetic induction panel 53, and the heat-dissipating sheet 55 may be arranged in the support groove 215e. The display 150 may be provided with the panel module 40 protruding over an end of the glass 50 by a certain distance (e.g., the width of the non-display area 44b), the electromagnetic induction panel 53 disposed in parallel with the panel module 40, and the heat-dissipating sheet 55.

A rail groove 216c for receiving the display protective member 240 may be disposed in at least one side of the upper surface of the support body 215_1. The rail groove 216c may extend to the inside of the support groove 215e.

Figure 3A:
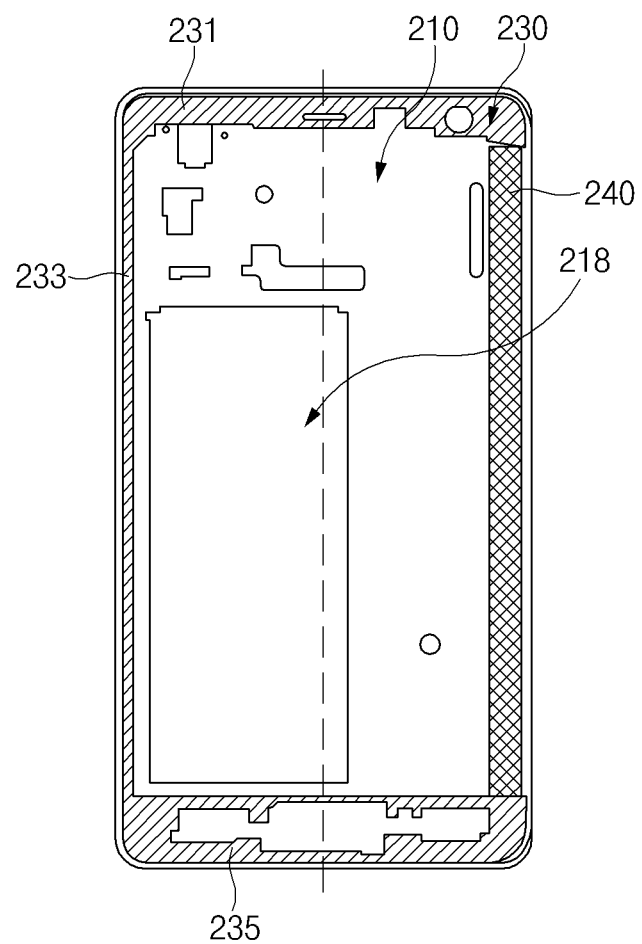
FIG. 3A is a diagram illustrating a front view of a part of an electronic device according to an exemplary embodiment.

FIG. 3A is a diagram illustrating a front view of a part of an electronic device according to an exemplary embodiment.

Referring to FIG. 3A, the part of the electronic device may include the first case 210, an adhesive member 230, and the protective member 240.

The first case 210 may be, for example, a front case of the electronic device. The first case 210 may be made of, for example, a metallic material. As illustrated in FIG. 3A, the battery upper part insertion hole 218 may be formed inside the first case 210. The battery upper part insertion hole 218 may be biased to one side with respect to a vertical center line of the first case 210, as illustrated in FIG. 3A.

The adhesive member 230 may include a first adhesive area 231 of a certain thickness disposed at an upper edge of the first case 210, a second adhesive area 233 of a certain thickness disposed at an edge of a side part (e.g., a left side part) of the first case 210, and a third adhesive area 235 of a certain thickness disposed at an edge of a lower part of the first case 210. The first to third adhesive areas 231, 233 and 235 may be connected to each other. The first to third adhesive layers 231, 233 and 235 may serve to fix the display 150 to the first case 210. According to an exemplary embodiment, the second adhesive area 233 may be disposed under an area where the first curved surface part 151 of the display 150 is disposed. For example, the second adhesive area 233 may serve to fix the first curved surface part 151 of the display 150 to the first case 210. A part of an edge of a side part (right side) of the first adhesive area 231 may be disposed at an edge of a side part (right side) of the first case 210. A part of an edge of a side part (right side) of the third adhesive area 235 may be disposed at an edge of a side part (right side) of the first case 210. According to exemplary embodiments, the adhesive member 230 may include the first adhesive area 231 and the third adhesive area 235.

The protective member 240 may be disposed at an edge of a side part (e.g., a right side part) of the first case 210 with a certain width. According to exemplary embodiments, the protective member 240 may be a sponge or an adhesive tape.

Figure 3B:
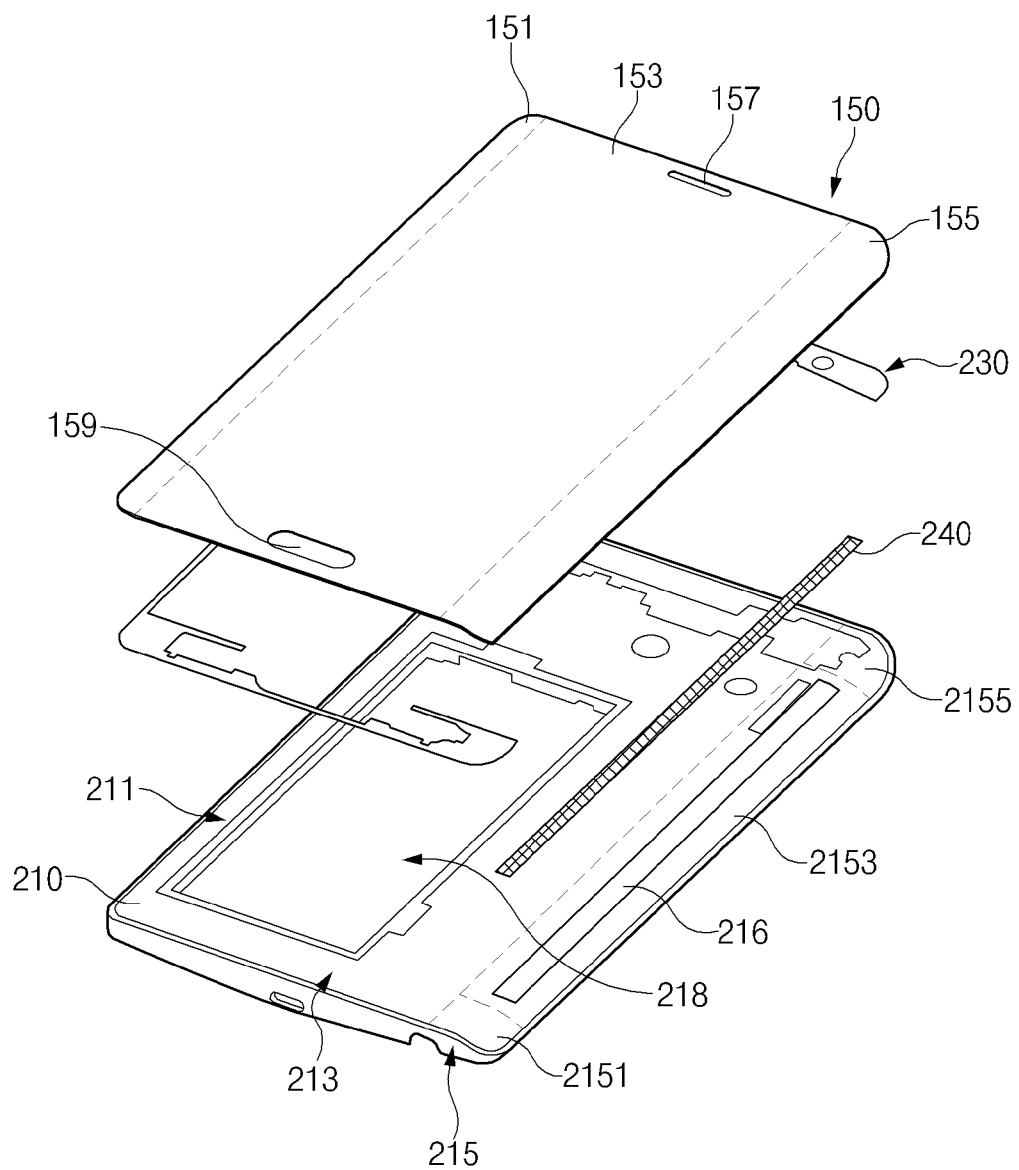
FIG. 3B is a diagram illustrating an exploded view of an electronic device according to an exemplary embodiment.

FIG. 3B is a diagram illustrating an exploded view of an electronic device according to an exemplary embodiment.

Referring to FIG. 3B, the electronic device may include the display 150, the first case 210, the adhesive member 230, and the protective member 240.

As illustrated in FIG. 3B, the display 150 may include the first curved surface part 151, the flat surface part 153, and the second curved surface part 155. A speaker hole 157 for exposing a speaker (or a receiver) and a button hole 159 for exposing a home button may be arranged at one side of the display 150.

The first case 210 may include the first curved surface support part 211 of which a surface that faces (e.g., opposes) the first curved surface part 151 has a curvature similar to the curvature of the first curved surface part 151, the second curved surface support part 215 of which a surface that faces (e.g., opposes) the second curved surface part 155 has a curvature similar to the curvature of the second curved surface part 155, and the flat surface support part 213 of which an area that faces (e.g., opposes) the flat surface part 153 defines the battery upper part insertion hole 218. According to exemplary embodiments, an antenna pattern may be disposed on an upper part or a lower part of the first case 210.

The second curved surface support part 215 of the first case 210 may include, for example, a second curved surface support area 2155, on which a part of an upper side of the adhesive member 230 is disposed, a first curved surface support area 2151, on which a part of a lower side of the adhesive member 230 is disposed, and a third curved surface support area 2153, connecting the second curved surface support area 2155 to the first curved surface support area 2151. The rail groove 216 for receiving the protective member 240 may be disposed in the curved surface support area 2153.

The adhesive member 230, which is continuously disposed on an upper part of the display 150 (or the second curved surface support area 2155 and an upper side of the flat surface support part 213), an edge of the first curved surface part 151, and a lower part of the display 150 (or the first curved surface support area 2151 and a lower side of the flat surface support part 213), may be shaped like a "C". According to exemplary embodiments, the adhesive member 230 may be only disposed on an upper part of the display 150 and a lower part of the display 150. As described above, the adhesive member 230 may be disposed on at least a part of a circumference of the first case 210.

The protective member 240 may be disposed on the second curved surface support part 215 (e.g., a location where the second curved surface part 155 of the display 150 is disposed) with a certain length. According to an exemplary embodiment, the protective member 240 may have a length corresponding to a length of the third curved surface support area 2153. The protective member 240 may be placed in the rail groove 216 disposed in the third curved surface support area 2153.

Figure 4:
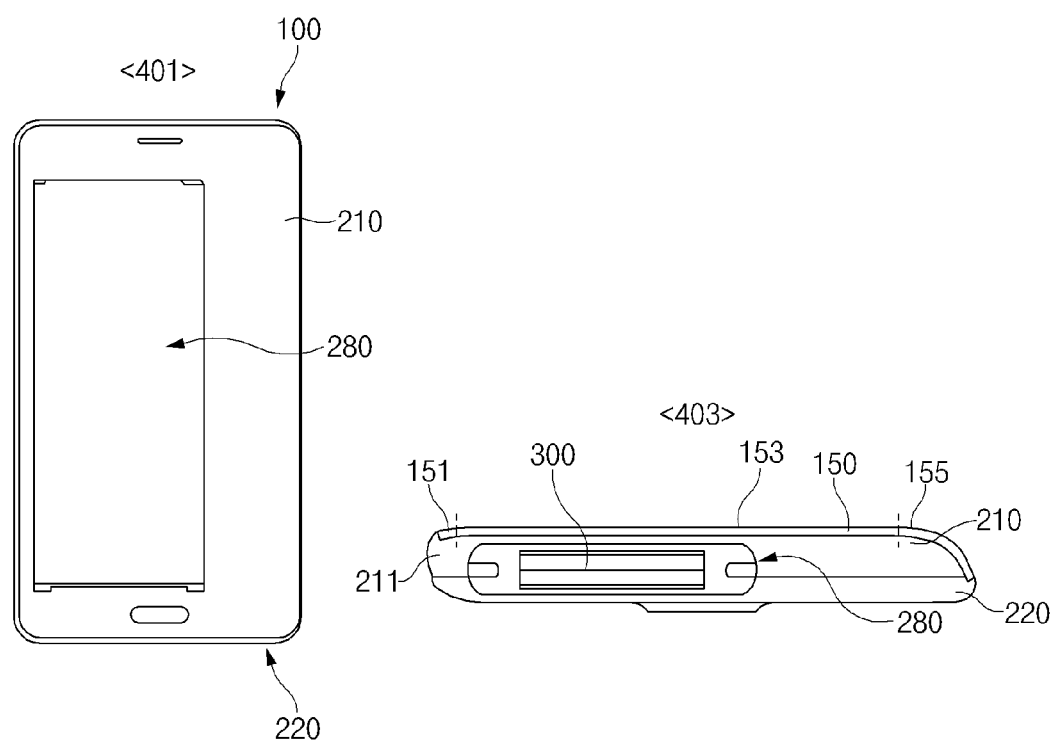
FIG. 4 is a diagram illustrating element arrangement of an electronic device according to an exemplary embodiment.

FIG. 4 is a diagram illustrating a back of an electronic device according to an exemplary embodiment.

Referring to FIG. 4, as illustrated in a state 401, the back of the electronic device 100 may include a battery placing part 280 provided by aligning the battery upper part insertion hole and the battery lower part insertion hole disposed in the first and second cases 210 and 220 respectively. The battery placing part 280 may be biased leftwards with respect to a vertical center line of the electronic device 100. For example, as illustrated in a state 403, a battery 300 may be biased to a left side of the electronic device 100. For example, the battery 300 may be biased to the first curved surface part 151 of the display 150 or the first curved surface support part 211 of the first case 210. Accordingly, a location where the battery 300 is placed may alter a center of gravity of the electronic device 100 away from a center line of the electronic device. Therefore, the electronic device 100 may have a tendency to fall in a direction in line with the center of gravity altered by the location of the battery 300.

Figure 5:
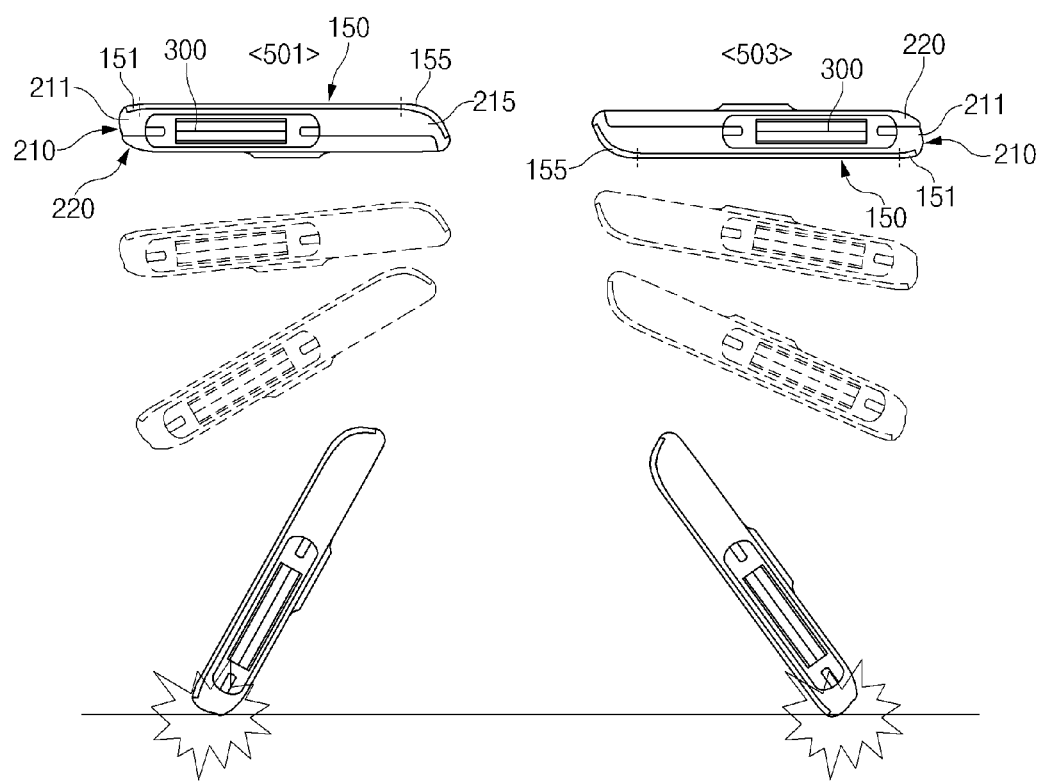
FIG. 5 illustrates falling states of an electronic device according to an exemplary embodiment.

FIG. 5 illustrates falling states of an electronic device according to an exemplary embodiment.

Referring to FIG. 5, as illustrated in a state 501, in the case in which the electronic device 100 is dropped from a height, with the back of the electronic device facing downwards (e.g., with the display 150 facing upwards), a part of the electronic device including the first curved surface part 151 (or a part where the battery 300 is disposed) may rotate downwards. Therefore, a rear part of the first curved surface part 151 in which the battery 300 is disposed (e.g., the first curved surface support part 211 of the first case 210 or an area of the second case 220 coupled to the first curved surface support part 211) may be more likely to impact the ground. Because an area including the first curved surface part 151, for which a case is relatively thick, impacts the ground, a shock is absorbed by the case so that damage to the second curved surface part 155 may be prevented.

According to exemplary embodiments, as illustrated in a state 503, in the case in which the electronic device 100 is dropped from a height with the front side facing downwards (e.g., with the display 150 facing downwards), a part of the electronic device including the first curved surface part 151 (or a part where the battery 300 is disposed) may rotate downwards. Therefore, a front part of the first curved surface part 151 in which the battery 300 is disposed or the first case 210 covering the first curved surface part 151 may be more likely to impact the ground. Because an area including the first curved surface part 151, of which the curvature is relatively low or for which a thickness of a side of a thickness is larger than that for the second curved surface part 155, impacts the ground, a shock is absorbed by the case so that damage to the second curved surface part 155 may be prevented.

Figure 6:
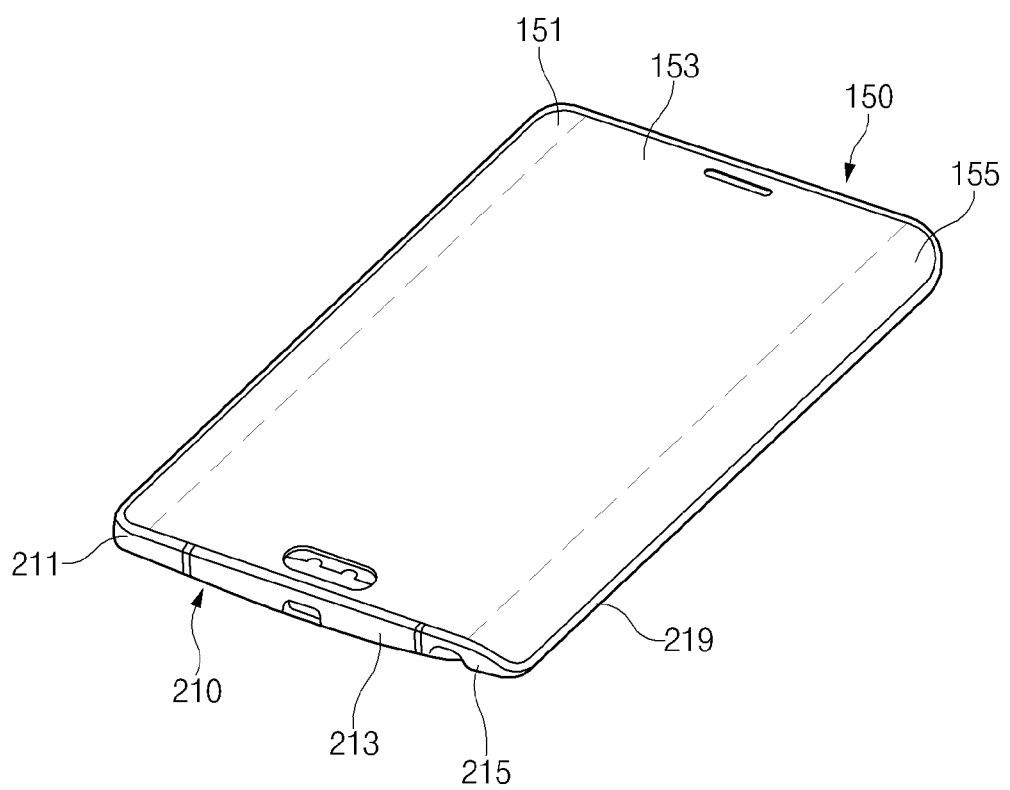
FIG. 6 illustrates a case on which a display is placed according to an exemplary embodiment.

FIG. 6 illustrates a case on which a display is placed according to an exemplary embodiment.

Referring to FIG. 6, the display 150 may include the first curved surface part 151, the flat surface part 153, and the second curved surface part 155. The display 150 may be disposed on a front surface of the first case 210. The first curved surface part 210 may include curved surface support parts having curvatures corresponding to those of the first and second curved surface parts 151 and 155.

According to exemplary embodiments, a guard 219 may be disposed at an edge of an end of the second curved surface support part 215 of the first case 210. The guard 219 may cover an edge of the second curved surface part 155. Furthermore, the guard 219 may protrude over a surface of the second curved surface part 155 by a certain distance. Alternatively, in the case where an adhesive member is interposed between the display 150 and the first case 210, the guard 219 may protrude over a surface of the display 150. Therefore, the guard 219 may prevent the second curved surface part 155 of the electronic device 100 from being damaged when contacting another object, for example when free falling.

Figure 7:
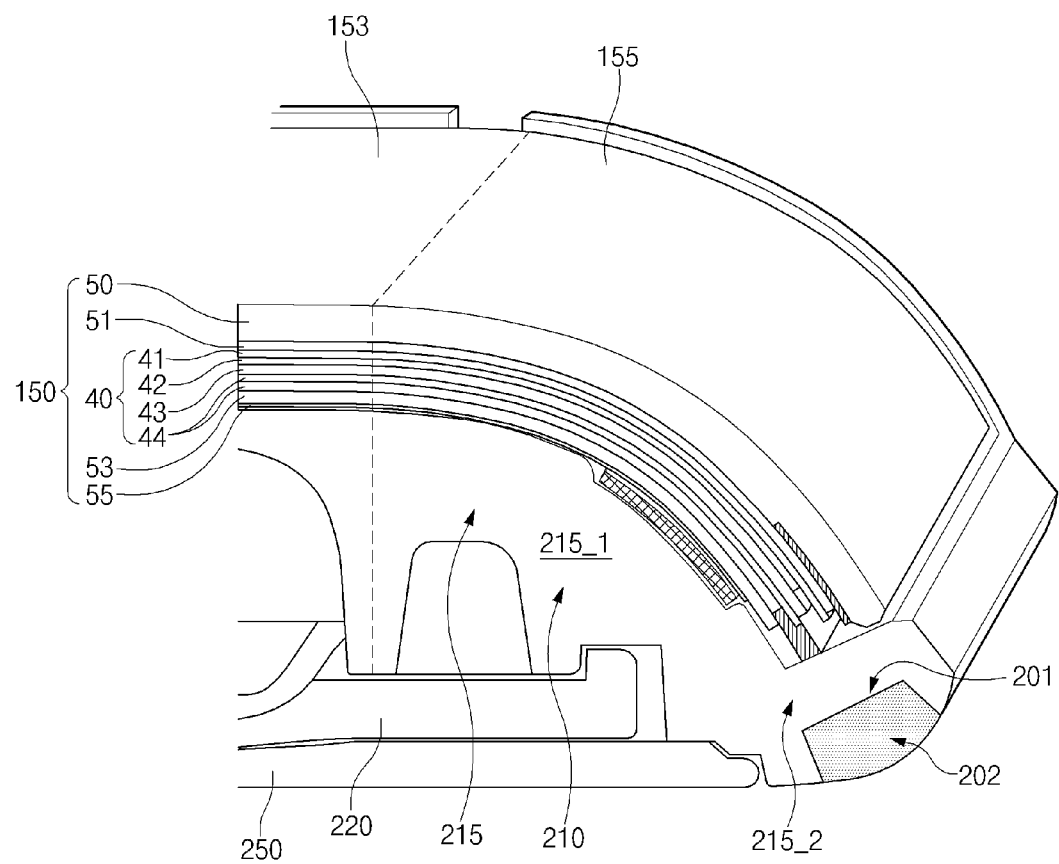
FIG. 7 illustrates a part of an electronic device in which a reinforcing member is disposed according to an exemplary embodiment.

FIG. 7 illustrates a part of an electronic device in which a reinforcing member is disposed according to an exemplary embodiment.

Referring to FIG. 7, the electronic device may include the display 150, the first case 210, the second case 220, and the battery cover 250. A part of the display 150 may include, for example, the flat surface part 153 and the second curved surface part 155. The second curved surface part 155 may be bent to a certain curvature. The second curved surface part 155 may be disposed on the second curved surface support part 215 of the first case 210. According to an exemplary embodiment, an end of the second curved surface part 155 may face a side surface of the curved surface cover part 215_2.

The first case 210 may include the support body 215_1 and the curved surface cover part 215_2. The support body 215_1 may support the second curved part 155 of the display 150. The curved surface cover part 215_2, contiguous to the support body 215_1, may support an end of the display 150.

According to exemplary embodiments, an auxiliary groove 201 having a certain width may be disposed in a longitudinal direction in at least one of surfaces of the curved surface cover part 215_2 exposed to the outside. A reinforcing member 202 may be disposed in the auxiliary groove 201. The auxiliary groove 201 may be opened in a direction in which the second curved surface part 155 of the display 150 extends while being bent.

The reinforcing member 202 may be placed in the auxiliary groove 201 formed in the curved surface cover part 215_2. A thickness of the reinforcing member 202 may be larger than a depth of the auxiliary groove 201. Therefore, the reinforcing member 202 may protrude over an end of an opening of the auxiliary groove 201. According to exemplary embodiments, at least a part of an outer surface of the reinforcing member 202 may be rounded. The reinforcing member 202 may include a material capable of absorbing a shock due to contact with an object. For example, the reinforcing member 202 may be formed of at least one of a non-metallic material or a metallic material. The reinforcing member 202 may have a mesh structure for increasing a shock absorbing rate.

Figure 8:
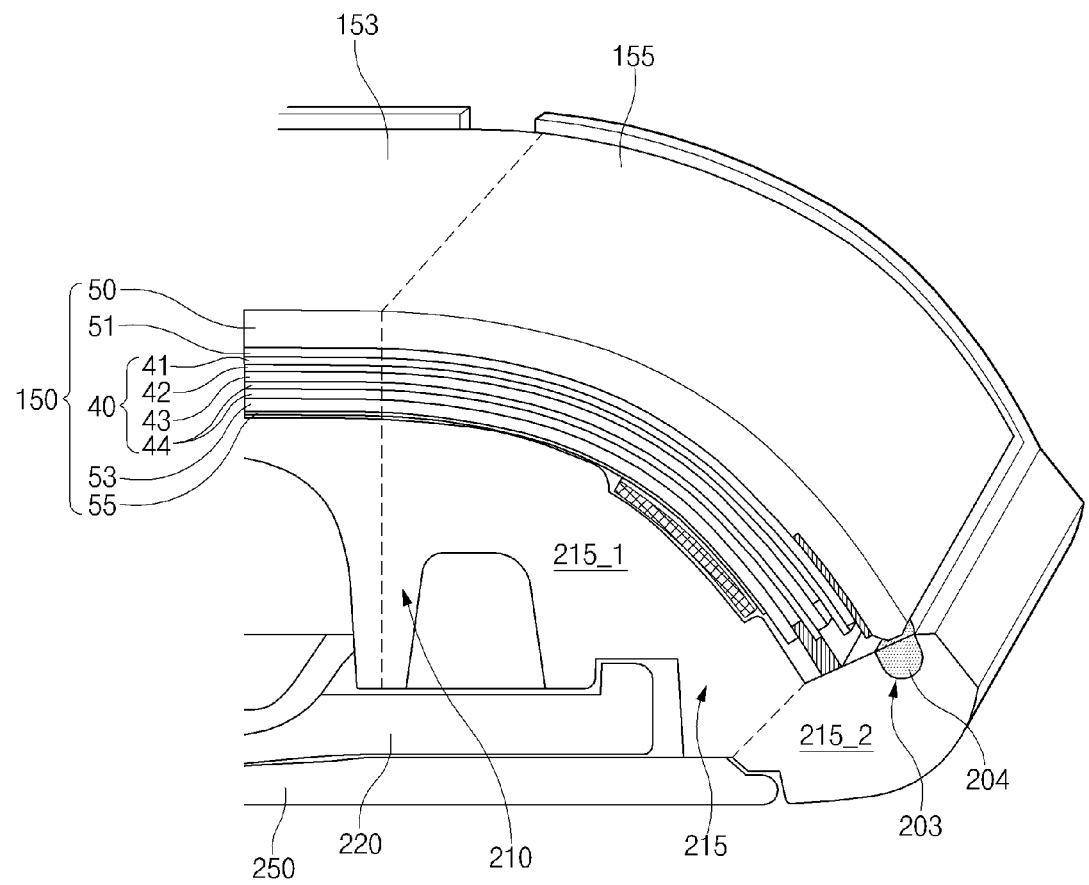
FIG. 8 illustrates a part of an electronic device in which a shock absorbing member is disposed according to an exemplary embodiment.

FIG. 8 illustrates a part of an electronic device in which a shock absorbing member is disposed according to an exemplary embodiment.

Referring to FIG. 8, the electronic device may include the display 150, the first case 210, the second case 220, and the battery cover 250. The display 150 may include the flat surface part 153 and the second curved surface part 155. The first case 210 may include the second curved surface support part 215 corresponding to the second curved surface part 155. The second curved surface support part 215 may include the support body 215_1 and the curved surface cover part 215_2.

According to exemplary embodiments, a rail groove 203 may be disposed in a longitudinal direction in a side surface of the curved surface cover part 215_2 (e.g., a surface facing an end of the display 150). A shock absorbing member 204 may be disposed in the rail groove 203. The shock absorbing member 204 may include various materials and structures for dispersing or absorbing an external or internal shock. For example, the shock absorbing member 204 may be formed as a solid (the inside of which is filled) using rubber, flexible plastic, or mixtures thereof. Furthermore, the shock absorbing member 204 may be formed of a non-metallic material or a metallic material, and may have a mesh structure.

According to exemplary embodiments, a width of the rail groove 203 may have an opening width (e.g., a thickness of the display 150 except for the glass 50) similar to a width of a side surface of the curved surface cover part 215_2. In this case, the shock absorbing member 204 disposed in the rail groove 203 may prevent the panel module 40, the electromagnetic induction panel 53 and the heat-dissipating sheet 55 of the display 150 from being damaged.

According to exemplary embodiments, the electronic device may employ both the reinforcing member structure of FIG. 7 and the shock absorbing member structure of FIG. 8.

Figure 9:
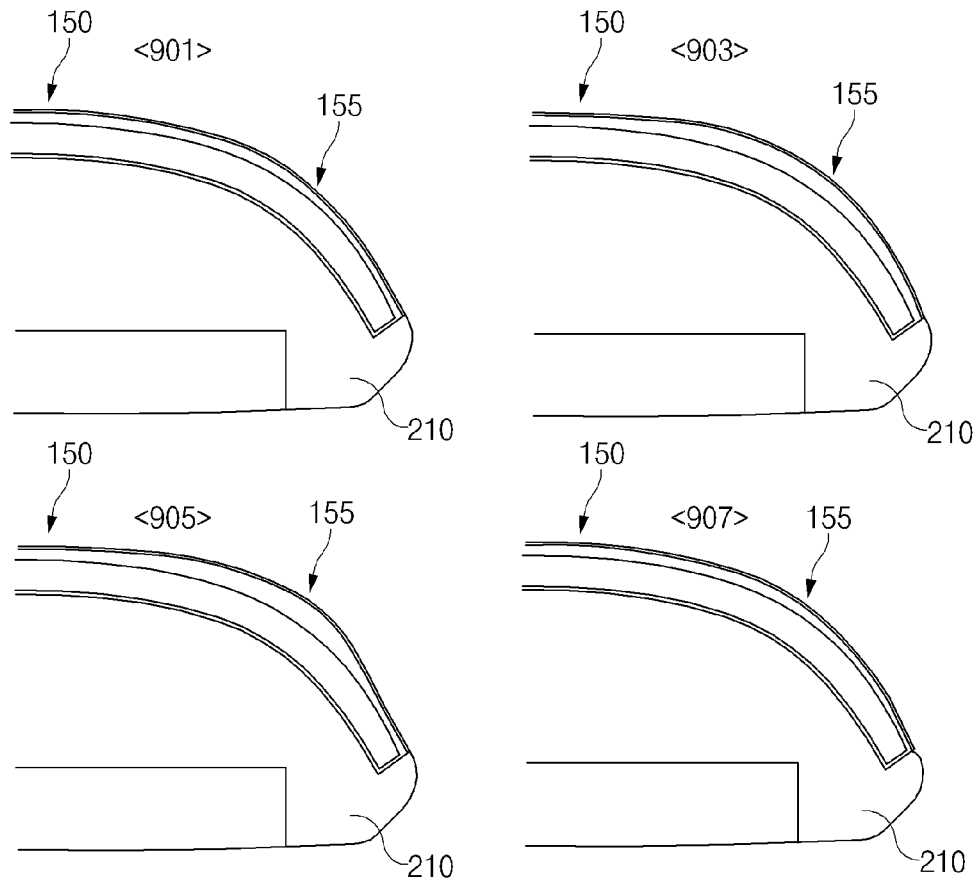
FIG. 9 illustrates examples of the shape of a curved surface part according to exemplary embodiments.

FIG. 9 illustrates examples of the shape of a curved surface part according to exemplary embodiments.

Referring to FIG. 9, as illustrated in a state 901, the second curved surface part 155 of the display 150 may bent to have a protruding amount that is the same as the protruding amount (e.g., about 0.05 mm to about 0.3 mm) of a flat surface part of the display 150 (on the basis of a horizontal line of the flat surface part). Alternatively, as illustrated in a state 903, the second curved surface part 155 of the display 150 may have a protruding amount (e.g., about 0.3 mm to about 0.5 mm) that is larger than the protruding amount of the flat surface part. Alternatively, as illustrated in a state 905, the curved part may further protrude compared to the flat surface part. Alternatively, as illustrated in a state 907, the second curved surface part 155 of the display 150 may gradually decrease in a side part protruding amount compared to the flat surface part.

According to an exemplary embodiment, the curvature of the second curved surface part 155 may be adjusted so that at least a part of an end of the second curved surface part 155 has a straight line section or a straight-line-like curve section (e.g., a part of a curve having a radius larger than a predetermined value) to stably press the second curved surface part 155 of the display 150 against the curved surface support part of the first case 210 for the purpose of easy assembling of the display 150. The curved surface support part of the first case 210 (e.g., an end of the curved surface support part) may have a flat surface to correspond to the straight line section of the second curved surface part 155 (e.g., a part of an end of the second curved surface part 155). For example, at an interface area between the support body and the curved surface cover part, at least a part of the support part may have a flat surface.

According to exemplary embodiments, the curved surface support part of the first case 210 may have a protruding amount or a curvature corresponding to the curvature or the protruding amount of the second curved surface part 155 mentioned above with respect to the states 901 to 907. Alternatively, the curved surface support part of the first case 210 may have the same curvature regardless of the curvature or the protruding amount of the second curved surface part 155.

Figure 10:
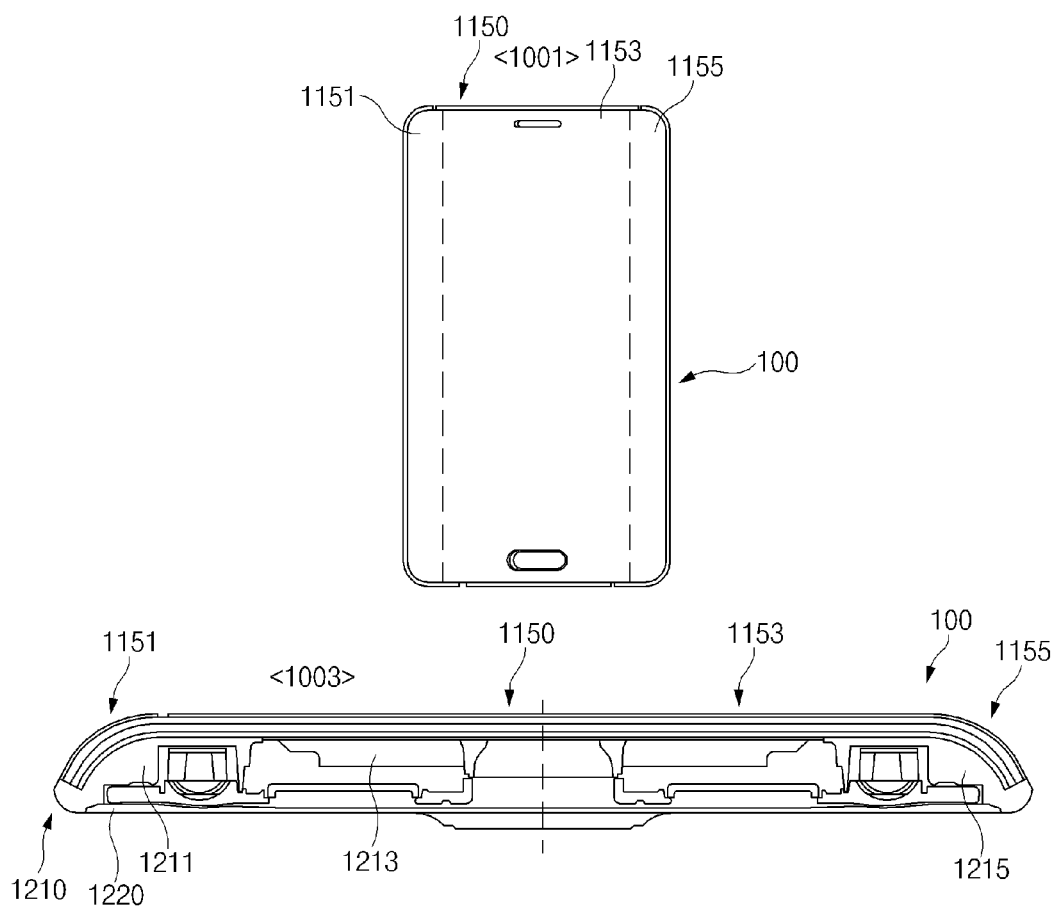
FIG. 10 illustrates an electronic device having a symmetric curved surface structure according to an exemplary embodiment.

FIG. 10 illustrates an electronic device having a symmetric curved surface structure according to an exemplary embodiment.

Referring to FIG. 10, as illustrated in a state 1001, a display 1150 of the electronic device 100 may include a first curved surface part 1151, a flat surface part 1153, and a second curved surface part 1155. The first and second curved surface parts 1151 and 1155 may have the same curvature. For example, the first curved surface part 1151 may be symmetric with the second curved surface part 1155 with respect to a vertical center line of the flat surface part 1153. Furthermore, as illustrated in a state 1003, the electronic device 100 may include the display 1150 of which both curved surface parts are symmetric with each other, a first case 1210, and a second case 1220. The first case 1210 may include a first curved surface support part 1211 supporting the first curved surface part 1151, a flat surface support part 1213 supporting the flat surface part, and a second curved surface support part 1215 supporting the second curved surface part 1155. An upper surface of the first curved surface support part 1211 may have a curvature similar to that of the first curved surface part 1151. An upper surface of the second curved surface support part 1215 may have a curvature similar to that of the second curved surface part 1155. Therefore, the first case 1210 may have an upper surface of which both side edges are symmetric with each other with respect to a vertical center line of the electronic device 100. The second case 1220 may be disposed under the first case 1210 to support the first case 1210.

Figure 11:
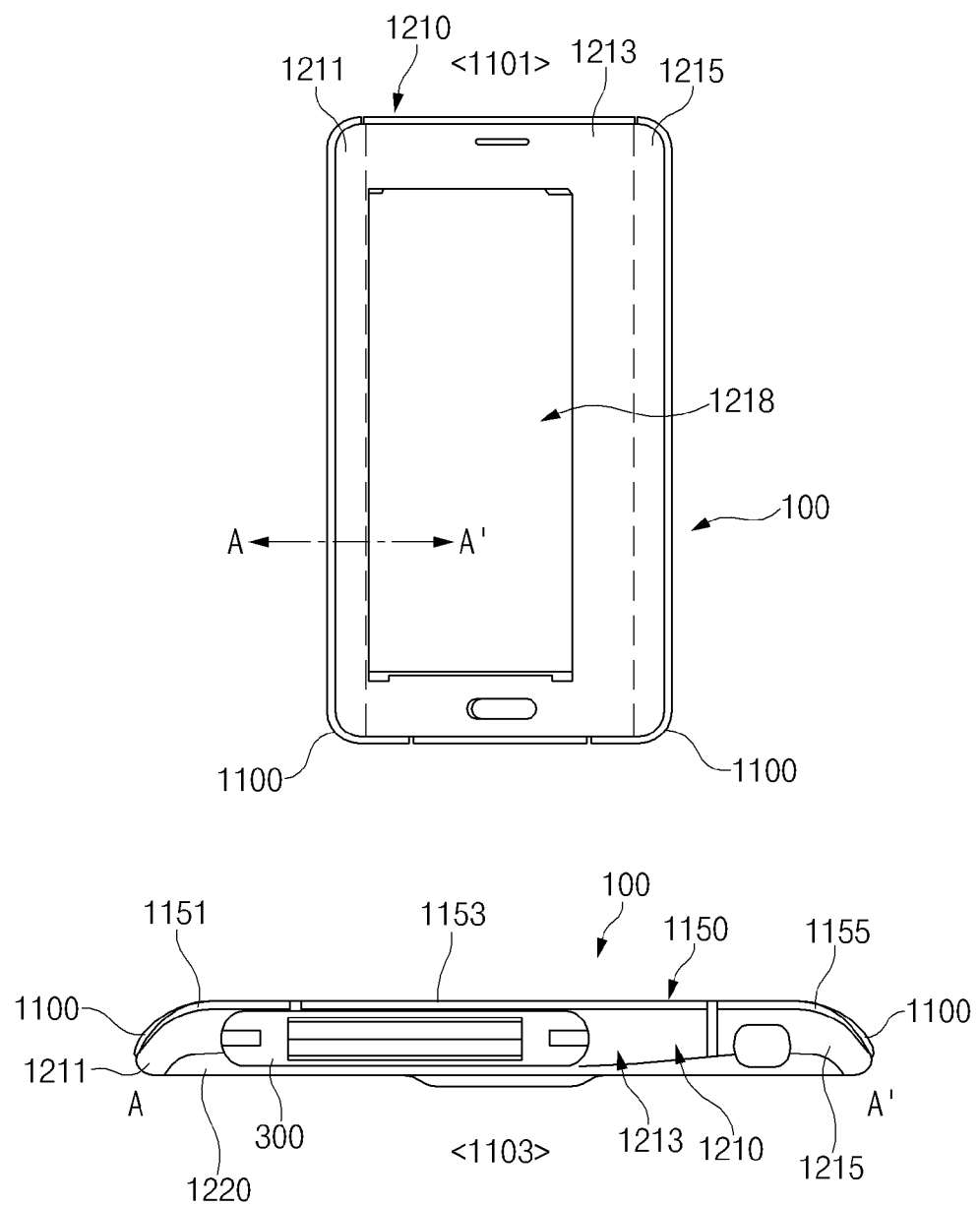
FIG. 11 illustrates a reinforcing structure of an electronic device having a symmetric curved surface structure according to an exemplary embodiment.

FIG. 11 illustrates a reinforcing structure of an electronic device having a symmetric curved surface structure according to an exemplary embodiment.

Referring to FIG. 11, as illustrated in a state 1101, the first case 1210 of the electronic device 100 may include the first curved surface support part 1211, the flat surface support part 1213, and the second curved surface support part 1215. The first and second curved surface support parts 1211 and 1215 may be symmetric with each other with respect to a vertical center line of the electronic device 100. An upper surface of the first curved surface support part 1211 and an upper surface of the second curved surface support part 1215 may have the same or similar curvature.

A battery upper part insertion hole 1218 may be disposed inside the flat surface support part 1213. A vertical length of the battery upper part insertion hole 1218 may be larger than a horizontal length thereof. According to exemplary embodiments, the battery upper part insertion hole 1218 may be biased to one side with respect to a center line of the electronic device 100. According to an exemplary embodiment, an area of the battery upper part insertion hole 1218 biased to the first curved surface support part 1211 may be larger than an area of the battery upper part insertion hole 1218 biased to the second curved surface support part 1215.

According to exemplary embodiments, a damage prevention member 1100 may be disposed at an edge of the first case 1210. The damage prevention member 1100 may protrude by a certain distance along an edge of the first curved surface support part 1211 and an edge of the second curved surface support part 1215. A height of the damage prevention member 1100 may be larger than that of a surface of the display 1150 by a certain distance after the display 1150 is placed. For example, as illustrated in a state 1103, the damage prevention member 1100 may protrude over the first curved surface part 1151 or the second curved surface part 1155 of the display 1150.

Referring to the state 1103, the electronic device 100 may include the first and second curved surface parts 1151 and 1155 symmetric with each other with respect to a center line of the electronic device, and the flat surface part 1153 disposed between the first and second curved surface parts 1151 and 1155. The first and second curved surface parts 1151 and 1155 may have the same or similar curvature.

The first curved surface support part 1211 may be disposed under the first curved surface part 1151 to support the first curved surface part 1151. The second curved surface support part 1215 may be disposed under the second curved surface part 1155 to support the second curved surface part 1155. The flat surface support part 1213 may support a center part of the display 1150, for example, the flat surface part. At least a part of the battery 300 may be disposed in the battery upper part insertion hole 1218 illustrated in the state 1101. When the second case 1220 is joined to the first case 1210, the battery upper part insertion hole 1218 may be aligned with the battery lower part insertion hole of the second case 1220 to form a battery placing part. The battery 300 may be placed in the battery placing part. The battery placing part may be biased to the first curved surface part 1151 or the first curved surface support part 1211. Therefore, the battery 300 may be biased towards the first curved surface support part 1211.

Although it has been described that the damage prevention member 1100 is disposed on the first and second curved support parts 1211 and 1215, the damage prevention member 1100 may be disposed on the first curved support part 1211 alone. Alternatively, the damage prevention member 1100 disposed on the first curved surface support part 1211 may differ in structure or material from the damage prevention member 1100 disposed on the second curved surface support part 1215 to prevent damage to the first curved surface part 1151 due to the biased positioning of the battery 300. For example, the damage prevention member 1100 disposed on the first curved surface support part 1211 may employ a material or structure of which a shock absorbing amount is larger than that of the damage prevention member 1100 disposed on the second curved surface support part 1215.

According to exemplary embodiments of the present disclosure, a mobile electronic device may include a display including a flat area and a curved surface area extending from the flat area as one piece therewith, the curved surface area being curved towards one side of the flat area, the curved surface area having a size smaller than that of the flat area, and the display may include an external protective layer formed in a shape corresponding to that of the flat area and that of the curved surface area, an opaque area disposed at a part of an edge of the curved surface area under the external protective layer, and a panel module disposed under the external protective layer, the panel module having a display area and a non-display area, the display area being disposed over the flat area and a part of the curved surface area, the non-display area being disposed at the other part of the curved surface area, wherein, with respect to a $1a^{th}$ direction (e.g., a first direction) at the curved surface area of the external protective layer, an end of the non-display area further extends (or protrudes) in a diagonal direction than an end of the opaque layer by a $1a^{th}$ width (e.g., a first width), wherein, with respect to a $2a^{th}$ direction (e.g., a second direction) at the edge of the curved surface area, the end of the non-display area further extends (or protrudes) in the diagonal direction than the end of the opaque layer by a $2a^{th}$ width (e.g., a second width).

The first direction may be perpendicular to a tangent line to an arbitrary point on the curved surface area. The second direction may be perpendicular to the flat area.

According to exemplary embodiments of the present disclosure, the first width may substantially approximate to the second width, wherein the first width specified may be within about 1 mm or may be from about 0.02 mm to about 0.4 mm. The second width specified may be within about 1 mm or may be from about 0.2 mm to about 0.5 mm.

According to exemplary embodiments of the present disclosure, at least a part of the end of the curved surface area of the external protective layer and at least a part of an end of the panel module may be arranged in parallel with each other in the display.

According to exemplary embodiments of the present disclosure, a mobile electronic device may include a display including a flat area and a curved surface area extending from the flat area as one piece therewith, the curved surface area being curved towards one side of the flat area, the curved surface area having a size smaller than that of the flat area, and the display may include an external protective layer formed in a shape corresponding to that of the flat area and that of the curved surface area, an opaque area disposed at a part of an edge of the curved surface area under the external protective layer, and a panel module disposed under the external protective layer, the panel module having a display area and a non-display area, the display area being disposed over the flat area and a part of the curved surface area, the non-display area being disposed at the other part of the curved surface area, wherein, at the edge of the curved surface area, the opaque layer may substantially cover a greater part of the non-display area.

According to exemplary embodiments of the present disclosure, with respect to a first direction at the curved surface area of the external protective layer, an end of the non-display area may further extend in a diagonal direction over a boundary line between the non-display area and the display area by a first width so that the opaque layer may substantially cover the greater part of the non-display area.

According to exemplary embodiments of the present disclosure, with respect to a second direction at the edge of the curved surface area, the end of the non-display area may further extend in the diagonal direction than an end of the opaque layer by a second width so that the opaque layer may substantially cover the greater part of the non-display area.

According to exemplary embodiments of the present disclosure, with respect to a perpendicular direction to the flat area, the opaque layer may substantially cover the entirety of the non-display area geometrically.

According to exemplary embodiments of the present disclosure, with respect to the perpendicular direction to the flat area, the opaque layer may substantially cover the entirety of the non-display area optically by virtue of a refractive index of at least one layer included in the display.

According to exemplary embodiments of the present disclosure, the curved surface area may be disposed at edges of both sides of the display, or may be convex with respect to the flat area.

According to exemplary embodiments of the present disclosure, the mobile electronic device may further include at least one of a case disposed along an edge of the display, at least a part of the case protruding over a surface of the curved surface area, and an adhesive member disposed under the flat area of the display, the adhesive member being selectively disposed under at least a part of the curved surface area of the display.

According to exemplary embodiments of the present disclosure, the case may further include at least one of: a support groove to which the non-display area is insertable and a sidewall constituting a part of the support groove and facing a side surface of an edge of the external protective layer, a battery placing part biased in a direction away from the curved surface area with respect to a vertical center line of the mobile electronic device, a rail groove formed in a longitudinal direction in a surface of the case facing a back of an edge side of the display and a protective member inserted into the rail groove, an auxiliary groove formed in at least a part of a surface of the case exposed to the outside and a reinforcing member disposed in the auxiliary groove to absorb or disperse a shock, and a shock absorbing member disposed on one surface of a curved surface cover part facing an end of the edge of the display.

Figure 12:
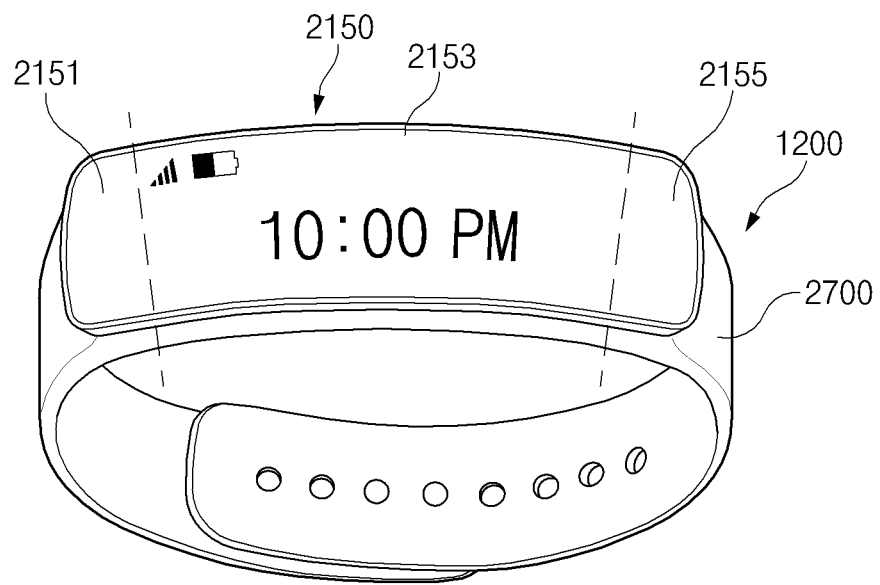
FIG. 12 illustrates a wearable device including a curved surface display area according to an exemplary embodiment.

FIG. 12 illustrates a wearable device including a curved surface display area according to an exemplary embodiment.

As described above, according to various embodiments of the present disclosure, a mobile electronic device may include a display including a flat area and a curved surface area extending from the flat area as one piece therewith, the curved surface area being bent towards one side of the flat area, the curved surface area having a size smaller than that of the flat area, and a case disposed along an edge of the display, at least a part of the case protruding over a surface of the curved surface area, wherein the display may include an external protective layer formed in a shape corresponding to that of the flat area and the curved area, an opaque area disposed at a part of an edge of the curved surface area under the external protective layer, and a panel module disposed under the external protective layer, the panel module having a display area and a non-display area disposed at one side of the display area, wherein a flat-area-side end of the opaque layer and a flat-area-side end of the non-display area are vertically aligned at the edge of the curved surface area so that the opaque layer covers an entirety of the non-display area.

According to various embodiments of the present disclosure, the opaque layer may be disposed on the non-display area such that a vertical line that connects the flat-area-side end of the opaque layer to the flat-area-side end of the non-display area is inclined at the edge of the curved surface area towards the flat area.

According to various embodiments of the present disclosure, the opaque layer may be disposed on the non-display area such that the vertical line that connects the flat-area-side end of the opaque layer to the flat-area-side end of the non-display area is inclined at the edge of the curved surface area towards the flat area from a designated angle at which the vertical line is inclined towards the edge of the curved surface area.

According to the various embodiments of the present disclosure, a mobile electronic device may include a display including a flat area and a curved surface area extending from the flat area as one piece therewith, the curved surface area being bent towards one side of the flat area, the curved surface area having a size smaller than that of the flat area, and a case disposed along an edge of the display, at least a part of the case protruding over a surface of the curved surface area. Here, the display may include an external protective layer formed in a shape corresponding to that of the flat area and the curved surface area, an opaque area disposed at a part of an edge of the curved surface area under the external protective layer, and a panel module disposed under the external protective layer, the panel module having a display area and a non-display area, the display area being disposed over the flat area and a part of the curved surface area, the non-display area being disposed at the other part of the curved surface area, wherein the opaque layer may cover an entirety of the non-display area with respect to a vertical direction to the flat area at the edge of the curved surface area.

According to various embodiments of the present disclosure, at least a part of an end of the curved surface area of the external protective layer and at least a part of an end of the panel module are arranged in parallel with each other in the display.

According to various embodiments of the present disclosure, the curved surface area may be convex with respect to the flat area.

According to various embodiments of the present disclosure, the mobile electronic device may include an adhesive member disposed under the flat area of the display, the adhesive member being selectively disposed under at least a part of the curved surface area of the display.

According to various embodiments of the present disclosure, a mobile electronic device may include a display including a flat area and a curved surface area extending from the flat area as one piece therewith, the curved surface area being bent towards one side of the flat area, the curved surface area having a size smaller than that of the flat area, and a case disposed along an edge of the display, at least a part of the case protruding over a surface of the curved surface area, wherein the display may include an external protective layer formed in a shape corresponding to that of the flat area and the curved surface area, and a panel module disposed under the external protective layer, the panel module having a display area and a non-display area, the display area being disposed over the flat area and a part of the curved area, the non-display area being disposed at the other part of the curved area. Here, an end of the panel module including at least a part of the non-display area may further extend than an end of the curved surface area of the external protective layer so as to be inserted into a support groove formed in one side of the case.

Referring to FIG. 12, an electronic device 1200 may be a wearable device. According to an exemplary embodiment, the electronic device 1200 may include a display 2150 that may be divided into a first curved surface part 2151, a flat surface part 2153, and a second curved surface part 2155. The first curved surface part 2151, the flat surface part 2153, and the second curved surface part 2155 may be continuously arranged. The first and second curved surface parts 2151 and 2155 may be curved surface display areas having different curvatures. The second curved surface part 2155 may have a greater curvature than a curvature of the first curved surface part 2151.

According to exemplary embodiments, the electronic device 1200 may include a joining part 2700 to which a device including the display 2150 may be detachably attached. The joining part 2700 may be wearable on at least a part of a body of a user. The joining part 2700 may include a placing part to which the display 2150 may be detachably attached. The joining part 2700 may further include a connection part coupled to the joining part 2700 at a side part of the display 2150 (e.g., a left side part of the first curved surface part 2151 and a right side part of the second curved surface part 2155). The above-mentioned guard may be disposed at an edge of the display 2150.

As described above, an electronic device according to exemplary embodiments may provide a display including a curved surface display area or a curved surface part on at least one of edge areas thereof, and an extended display area of the display by aligning and disposing a non-display area of the display (e.g., a non-display area of a panel module) under an opaque layer. In exemplary embodiments, an area of the display excepting glass (e.g., the non-display area of the panel module) may be inserted into a groove formed in one side of a case, and the display without the opaque layer may be provided. The groove may support strong bonding between the curved surface display area and the case.

A member such as a sponge may be disposed between the curved surface display area and the case to block moisture or dust and relieve a shock.

Furthermore, an area where a battery is disposed is biased to one side from a center line of the case so that the curved surface display area having a relatively low curvature or a non-curved surface display area (or an adjacent case) lands on the ground when the electronic device is dropped, thereby preventing damage to the electronic device. Here, a damage prevention member may be disposed on the non-curved surface display area or a display area having a relatively low curvature.

Regarding damage prevention, a case covering the curved surface display area may include a guard protruding over a surface of the display from an edge of the curved surface display area. Furthermore, a shock absorbing member may be disposed on at least one side of the case of the curved surface display area (e.g., at least one groove).

According to exemplary embodiments, an end of the curved surface display area may be deprived of curvature (straightened) to support easy joining to a case.

As described above, according to exemplary embodiments, the display may include glass having an edge at least a part of which has a certain curvature, an opaque layer disposed at the edge of the glass, and a panel module including a non-display area aligned under the opaque layer.

According to exemplary embodiments, the panel module may include a flat surface part and a curved surface part contiguous to the flat surface part, wherein the non-display area may be disposed at an edge of the curved surface part.

According to exemplary embodiments, an end of one side of the opaque layer and an end of the non-display area may be vertically aligned with each other.

According to exemplary embodiments, an end of one side of the opaque layer may vertically protrude over an end of the non-display area.

According to exemplary embodiments, the display may further include an adhesive layer disposed between the glass and the panel module.

According to exemplary embodiments, the display may further include at least one of an electromagnetic induction panel disposed under the panel module with a certain curvature and a heat-dissipating sheet disposed under the electromagnetic induction panel with a certain curvature.

According to exemplary embodiments, the glass and the panel module may include a first curved surface part having a first curvature, a flat surface part contiguous to the first curved surface part, and a second curved surface part contiguous to the flat surface part, the second curved surface part having a second curvature different from the first curvature.

According to exemplary embodiments, the glass and the panel module may include a first curved surface part having a first curvature, a flat surface part contiguous to the first curved surface part, and a second curved surface part contiguous to the flat surface part, the second curved surface part having the first curvature.

As described above, according to exemplary embodiments, an electronic device may include a display of glass having an edge at least a part of which has a certain curvature, an opaque layer disposed at the edge of the glass, and a panel module including a non-display area aligned under the opaque layer, and a case supporting the display.

According to exemplary embodiments, the case may include a groove into which the non-display area is inserted.

According to exemplary embodiments, the case may further include a rail groove formed in a longitudinal direction in a surface of the case facing the display and a protective member inserted into the rail groove.

According to exemplary embodiments, the case may further include a guard covering an edge of the display placed on the case, the guard protruding over a surface of the display by a certain distance.

According to exemplary embodiments, the case may further include an auxiliary groove formed in at least a part of a surface of the case exposed to the outside, and a reinforcing member disposed in the auxiliary groove to absorb or disperse a shock.

According to exemplary embodiments, the case may further include a curved surface support part facing an end of the display, a rail groove disposed in a side surface of the curved surface support part while facing the display, and a shock absorbing member disposed in the rail groove.

According to exemplary embodiments, the case may further include a battery placing part biased to a non-curved surface display area or an edge curved surface part having a lower curvature than that of the curved surface display area, with respect to a center line.

According to exemplary embodiments, an end of the curved surface display area of the display may be straightened by as much as a certain width.

According to exemplary embodiments, a case upper surface facing an end of the curved surface display area of the display may have a flat surface with a certain width.

According to exemplary embodiments, the electronic device may further include an adhesive member disposed on at least a part of an edge between the display and the case.

According to exemplary embodiments, the electronic device may be a wearable device.

As described above, according to exemplary embodiments, an electronic device including a curved surface display area may include a display of glass having an edge at least a part of which has a certain curvature and a panel module protruding over an end of the glass, the panel module including a non-display area, and a case including a groove into which the non-display area is inserted.

According to exemplary embodiments, the electronic device may further include an opaque layer formed to a certain width at an end of the glass.

According to exemplary embodiments of the present disclosure, a display area may be substantially extended, while maintaining the size of an electronic device by adopting a curved surface display area and treating an edge area.

The exemplary embodiments of the present disclosure are illustrative and not limiting. Various alternatives and equivalents are possible. Other additions, subtractions, or modifications will be understood by the skilled artisan in view of the present disclosure and are intended to fall within the scope of the appended claims.

What is claimed is:

1. A mobile electronic device comprising:
   a case;
   a display having a flat area and a curved surface area extending from the flat area as one piece therewith, the curved surface area being curved towards one side of the flat area, the curved surface area having a size smaller than a size of the flat area,
   wherein the display comprises:
      an external protective layer formed in a shape corresponding to the flat area and the curved surface area;
      an opaque area disposed at a part of an edge of the curved surface area under the external protective layer; and a panel module disposed under the external protective layer, the panel module comprising a display area and a non-display area, the display area being disposed over the flat area and a first part of the curved surface area, and the non-display area being disposed at a second part of the curved surface area other than the first part of the curved surface area, wherein the case comprises a groove formed in a longitudinal direction in a surface of the case facing a back of an edge side of the display and a protective member inserted into the groove, wherein with respect to a first direction at the curved surface area of the external protective layer, an end of the non-display area extends in a diagonal direction farther than an end of the opaque layer by a first width, wherein, with respect to a second direction at the edge of the curved surface area, the end of the non-display area extends in the diagonal direction farther than the end of the opaque layer by a second width, and wherein the protective member is stuck to the groove.

2. The mobile electronic device of claim 1, wherein the external protective layer is configured to refract light such that the first width is perceived to be substantially equal to the second width when viewed through a surface of the external protective layer.

3. The mobile electronic device of claim 2, wherein the first width and the second width are about 1 mm or less.

4. The mobile electronic device of claim 3, wherein the first width is from about 0.02 mm to about 0.4 mm.

5. The mobile electronic device of claim 3, wherein the second width is from about 0.2 mm to about 0.5 mm.

6. The mobile electronic device of claim 1, wherein at least a part of an end of the curved surface area of the external protective layer and at least a part of an end of the panel module are arranged in parallel with each other in the display.

7. The mobile electronic device of claim 1, further comprising a case, wherein the case comprises: a support groove in which the non-display area is insertable; and a sidewall constituting a part of the support groove and facing a side surface of an edge of the external protective layer.

8. The mobile electronic device of claim 1, wherein the display further comprises at least one of:
an electromagnetic induction panel disposed on the curved surface area, the electromagnetic induction panel having a certain curvature;
a heat-dissipating sheet disposed on the curved surface area, the heat-dissipating sheet having a certain curvature; and
a touch sensing layer interposed between the external protective layer and the panel module, the touch sensing layer being curved at the curved surface area.

9. The mobile electronic device of claim 1, wherein the curved surface area is convex with respect to the flat area.

10. The mobile electronic device of claim 1, wherein the case comprises at least one of:
a battery placing part biased in a direction away from the second part of the curved surface area with respect to a vertical center line of the mobile electronic device;
an auxiliary groove formed in at least a part of a surface of the case exposed to the outside and a reinforcing member disposed in the auxiliary groove to absorb or disperse a shock; and
a shock absorbing member disposed on one surface of a curved surface cover part facing an end of the edge of the display.

11. The mobile electronic device of claim 1, further comprising:

an adhesive member disposed under the flat area of the display, the adhesive member being selectively disposed under at least a part of the curved surface area of the display.

12. The mobile electronic device of claim 1, wherein the curved surface area is formed on edges of both sides of the display.

13. The mobile electronic device of claim 1, wherein the protective member comprises at least one of a sponge and an adhesive tape.

14. A mobile electronic device comprising:
a display having a flat area and a curved surface area extending from the flat area as one piece therewith, the curved surface area being curved towards one side of the flat area, the curved surface area having a size smaller than a size of the flat area; and
a case disposed along an edge of the display, at least a part of the case protruding over a surface of the curved surface area, wherein the display comprises:
an external protective layer formed in a shape corresponding to the flat area and the curved surface area;
an opaque area disposed at a part of an edge of the curved surface area under the external protective layer; and
a panel module disposed under the external protective layer, the panel module comprising a display area and a non-display area, the display area being disposed over the flat area and a first part of the curved surface area, the non-display area being disposed at a second part of the curved surface area, wherein the case comprises a groove formed in a longitudinal direction in a surface of the case facing a back of an edge side of the display and a protective member inserted into the groove, wherein, at the edge of the curved surface area, the opaque layer substantially covers most part of the non-display area;

wherein, with respect to a first direction at an edge of the curved surface area of the external protective layer, an end of the non-display area extends in a diagonal direction over a boundary line between the non-display area and the display area by a first width so that the opaque layer substantially covers the non-display area; and wherein, with respect to a second direction at the edge of the curved surface area, the end of the non-display area extends in the diagonal direction farther than the end of the opaque layer by a second width so that the opaque layer substantially covers the non-display area, and wherein the protective member is stuck to the groove.

15. The mobile electronic device of claim 14, wherein, with respect to a perpendicular direction to the flat area, the opaque layer substantially covers a geometric entirety of the non-display area.

16. The mobile electronic device of claim 14, wherein, with respect to a perpendicular direction to the flat area, the opaque layer substantially covers an entirety of the non-display area optically by virtue of a refractive index of the display.

17. The mobile electronic device of claim 14, wherein the curved surface area is disposed at edges of both sides of the display, and the curved surface area is convex with respect to the flat area.

18. The mobile electronic device of claim 14, further comprising an adhesive member disposed under the flat area of the display, the adhesive member being selectively disposed under at least a part of the curved surface area of the display.

19. The mobile electronic device of claim 18, wherein the case further comprises at least one of: a support groove configured to receive insertion of the non-display area and a sidewall constituting a part of the support groove and facing a side surface of an edge of the external protective layer; a battery placing part biased in a direction away from the second part of the curved surface area with respect to a vertical center line of the mobile electronic device; an auxiliary groove formed in at least a part of a surface of the case exposed to an outside of the mobile electronic device and a reinforcing member disposed in the auxiliary groove configured to absorb or disperse a shock; and a shock absorbing member disposed on one surface of a curved surface cover part facing an end of the edge of the display.

20. The mobile electronic device of claim 14, wherein the protective member comprises at least one of a sponge and an adhesive tape.

* * * * *